US012107025B2

(12) United States Patent
Yamaguchi et al.

(10) Patent No.: US 12,107,025 B2
(45) Date of Patent: Oct. 1, 2024

(54) SEMICONDUCTOR DEVICE

(71) Applicant: Murata Manufacturing Co., Ltd., Nagaokakyo (JP)

(72) Inventors: Yohei Yamaguchi, Nagaokakyo (JP); Tomoyuki Ashimine, Nagaokakyo (JP); Yasuhiro Murase, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 359 days.

(21) Appl. No.: 17/580,683

(22) Filed: Jan. 21, 2022

(65) Prior Publication Data

US 2022/0139795 A1 May 5, 2022

Related U.S. Application Data

(63) Continuation of application No. PCT/JP2020/033990, filed on Sep. 8, 2020.

(30) Foreign Application Priority Data

Sep. 20, 2019 (JP) ................................. 2019-171533

(51) Int. Cl.
*H01L 23/31* (2006.01)
*H01G 4/224* (2006.01)
(Continued)

(52) U.S. Cl.
CPC ......... *H01L 23/3192* (2013.01); *H01G 4/224* (2013.01); *H01G 4/33* (2013.01);
(Continued)

(58) Field of Classification Search
CPC ... H01L 23/564; H01L 23/3171; H01L 27/04; H01L 21/822; H01L 28/40;
(Continued)

(56) References Cited

U.S. PATENT DOCUMENTS 10,991,509 B2  4/2021  Nakagawa et al.
11,145,711 B2  10/2021 Ashimine et al.
(Continued)

FOREIGN PATENT DOCUMENTS

JP  2019033154 A   2/2019
WO  2018211919 A1  11/2018
WO  2019021817 A1  1/2019

OTHER PUBLICATIONS

International Search Report issued for PCT/JP2020/033990, date of mailing Nov. 17, 2020.

*Primary Examiner* — Hrayr A Sayadian
(74) *Attorney, Agent, or Firm* — ArentFox Schiff LLP

(57) ABSTRACT

A semiconductor device that includes a semiconductor substrate having a first main surface and a second main surface; a dielectric film on the first main surface, the dielectric film having an electrode layer disposing portion and a protective layer covering portion, and a thickness of the protective layer covering portion in a first outer peripheral end of the dielectric film is smaller than a thickness of the electrode layer disposing portion; a first electrode layer on the electrode layer disposing portion; a first protective layer covering a second outer peripheral end of the first electrode layer and at least a part of the protective layer covering portion; and a second protective layer covering the first protective layer, wherein the first protective layer has a relative permittivity lower than that of the second protective layer, and the second protective layer has moisture resistance higher than that of the first protective layer.

20 Claims, 12 Drawing Sheets

(51) Int. Cl.
*H01G 4/33* (2006.01)
*H01L 49/02* (2006.01)
*H01G 4/12* (2006.01)
*H01G 4/30* (2006.01)

(52) U.S. Cl.
CPC .......... *H01L 23/3171* (2013.01); *H01L 28/40* (2013.01); *H01G 4/1272* (2013.01); *H01G 4/306* (2013.01)

(58) Field of Classification Search
CPC .... H01L 23/3192; H01G 4/252; H01G 4/385; H01G 4/224; H01G 4/33; H01G 4/1272; H01G 4/306; H01G 4/228
USPC .......................................... 257/160
See application file for complete search history.

(56) References Cited

U.S. PATENT DOCUMENTS

| | | | | |
|---|---|---|---|---|
| 2004/0061437 | A1* | 4/2004 | Ikagawa | H05B 33/04 |
| | | | | 313/506 |
| 2007/0194711 | A1* | 8/2007 | Matsuura | H10K 59/8722 |
| | | | | 313/503 |
| 2015/0035156 | A1* | 2/2015 | Ichinose | H01L 23/53223 |
| | | | | 438/622 |
| 2019/0378893 | A1 | 12/2019 | Ashimine et al. | |
| 2020/0066445 | A1 | 2/2020 | Nakagawa et al. | |

* cited by examiner

SEMICONDUCTOR DEVICE

CROSS REFERENCE TO RELATED APPLICATIONS

The present application is a continuation of International application No. PCT/JP2020/033990, filed Sep. 8, 2020, which claims priority to Japanese Patent Application No. 2019-171533, filed Sep. 20, 2019, the entire contents of each of which are incorporated herein by reference.

FIELD OF THE INVENTION

The present invention relates to a semiconductor device.

BACKGROUND OF THE INVENTION

In the related art, a capacitor structure in a semiconductor device is described in Japanese Patent Application Laid-Open No. 2019-33154 (Patent Document 1). This capacitor structure is provided on an insulation film of a substrate. The capacitor structure includes a second electrode layer disposed on a part of the insulation film, an interlayer insulation film (dielectric film) covering the second electrode layer, a metal film disposed on a part of the interlayer insulation film, a first electrode layer disposed on the metal film, and a protective insulation film (protective layer) covering a portion from an end portion of the first electrode layer to the insulation film continuously.

Patent Document 1: Japanese Patent Application Laid-Open No. 2019-33154

SUMMARY OF THE INVENTION

In recent years, as a case of applying a high voltage to the semiconductor device increases, demand for a high withstand voltage (high dielectric breakdown strength) of the semiconductor device has increased. However, it is not easy to realize high moisture resistance and high dielectric breakdown strength under such a high voltage.

An object of the present disclosure is to provide a semiconductor device having high moisture resistance and high dielectric breakdown strength.

As a result of intensive studies to solve the above problems, the present inventors have obtained the following findings. First, in order to obtain high moisture resistance, the present inventors have confirmed that the moisture resistance can be improved by forming a first electrode layer on a dielectric film provided on a part of a semiconductor substrate and at a central portion of the dielectric film, and reducing a thickness of the dielectric film disposed on an outer side of the first electrode layer. However, it has been found that, when the thickness of the dielectric film disposed on the outer side of the first electrode layer is reduced, for example, the withstand voltage between a second outer peripheral end of the first electrode layer and a first main surface of the semiconductor substrate is decreased. As a result of further studies, it has been found that both the high moisture resistance and the high dielectric breakdown strength can be achieved by configuring the protective layer with a first protective layer having a low relative permittivity (accordingly, having the high dielectric breakdown strength) and a second protective layer having moisture resistance higher than that of the first protective layer. The invention according to the present disclosure is based on the above findings obtained by the present inventors by themselves, and the present disclosure includes the following aspects.

In order to achieve the above object, according to an aspect of the present disclosure, there is provided a semiconductor device including: a semiconductor substrate that includes a first main surface and a second main surface opposite each other; a dielectric film on a part of the first main surface, the dielectric film having an electrode layer disposing portion and a protective layer covering portion, and a thickness of the protective layer covering portion in a first outer peripheral end of the dielectric film is smaller than a thickness of the electrode layer disposing portion of the dielectric film; a first electrode layer on the electrode layer disposing portion of the dielectric film; a first protective layer continuously covering a second outer peripheral end of the first electrode layer and at least a part of the protective layer covering portion of the dielectric film; and a second protective layer covering the first protective layer, wherein the first protective layer has a relative permittivity lower than that of the second protective layer, and the second protective layer has moisture resistance higher than that of the first protective layer.

According to the aspect, the protective layer includes the first protective layer having a relative permittivity lower than that of the second protective layer, and the second protective layer disposed on the first protective layer and having moisture resistance higher than that of the first protective layer. As described above, the protective layer includes a plurality of layers having different functions (high dielectric breakdown strength and the moisture resistance). Accordingly, the semiconductor device has both the moisture resistance and the withstand voltage. More specifically, a thickness of the protective layer covering portion of the dielectric film in the first outer peripheral end is smaller than a thickness of the electrode layer disposing portion of the dielectric film. As described above, since the dielectric film has a thin film region having a relatively small thickness at least in the first outer peripheral end as the protective layer covering portion thereof, a step of a step portion of the second protective layer disposed on an end portion of the dielectric film (protective layer covering portion) can be reduced. When the step of the step portion is reduced, distortion of the second protective layer is reduced, and an internal stress generated in the second protective layer around the end portion of the dielectric film can be reduced. As a result, occurrence of cracks in the second protective layer around the end portion of the dielectric film can be suppressed. Accordingly, in the aspect, moisture can be prevented from entering the dielectric film through the cracks, and a decrease in the withstand voltage (decrease in the dielectric breakdown strength) of the dielectric film can be suppressed. By forming the protective layer covering portion of the dielectric film as the thin film region, as described above, a decrease in the withstand voltage in the vicinity of the end portion of the dielectric film due to the cracks is suppressed, and since the thickness of the dielectric film decreases in the thin film region, the withstand voltage between the second outer peripheral end of the first electrode layer and the first main surface of the semiconductor substrate decreases. On the other hand, by providing the first protective layer having a relative permittivity lower than that of the second protective layer and covering the second outer peripheral end of the first electrode layer, it is possible to suppress a decrease in the withstand voltage between the second outer peripheral end of the first electrode layer and the first main surface of the semiconductor substrate. Moreover, since the protective layer having a low relative permittivity can have a relatively high dielectric breakdown strength, and the first protective layer has a relatively low relative permittivity (relatively high dielectric breakdown strength), the dielectric breakdown between the end portion of the first electrode layer and the first main surface of the semiconductor substrate can be effectively suppressed, and the dielectric breakdown of the dielectric film can be suppressed. Accordingly, the semiconductor device according to the aspect has both the moisture resistance and the withstand voltage.

Furthermore, in the semiconductor device according to the aspect, the first protective layer continuously covers a portion from the end portion of the first electrode layer to at least a part of the protective layer covering portion.

According to the aspect, the first protective layer continuously covers a portion from the end portion of the first electrode layer to at least a part of the dielectric film. That is, the first protective layer has a relative permittivity lower than that of the second protective layer, and an area in which the first protective layer covers the first electrode layer increases. Therefore, the dielectric breakdown of the dielectric film between the end portion of the first electrode layer and the first main surface of the semiconductor substrate can be more effectively suppressed.

Furthermore, in the semiconductor device according to the aspect, the first protective layer continuously covers a portion from the second outer peripheral end of the first electrode layer to the first outer peripheral end of the protective layer covering portion.

According to the aspect, the first protective layer continuously covers a portion from the second outer peripheral end of the first electrode layer to the first outer peripheral end of the protective layer covering portion, and increases the area in which the first protective layer covers the first electrode layer. Therefore, the dielectric breakdown of the dielectric film between the end portion of the first electrode layer and the first main surface of the semiconductor substrate can be more effectively suppressed.

Furthermore, the semiconductor device according to the aspect further includes a first metal film between the first protective layer and the second protective layer and covering at least part of the first protective layer.

According to the aspect, the semiconductor device further includes the first metal film. The first metal film is disposed between the first protective layer and the second protective layer, and covers the first protective layer. Since the first metal film is formed of metal, it is difficult for moisture to pass through the first metal film. Accordingly, in a case where cracks occur in the second protective layer, the moisture is prevented from entering the dielectric film through the cracks. Therefore, according to the aspect, the dielectric breakdown of the dielectric film between the end portion of the first electrode layer and the first main surface of the semiconductor substrate can be more effectively suppressed. Furthermore, the first metal film is disposed between the first protective layer and a second protective layer. Therefore, a creeping distance of the surface of the protective layer increases, and occurrence of creeping discharge on the surface of the protective layer is more effectively suppressed.

Furthermore, in the semiconductor device according to the aspect, the first protective layer is covered by the second protective layer and the first metal film.

According to the aspect, the first protective layer is covered by the second protective layer and the first metal film. Therefore, the first protective layer is protected against moisture by the second protective layer and the first metal film having relatively high moisture resistance over the entire outer surface of the first protective layer. Accordingly, in the aspect, external moisture is prevented from entering the dielectric film through the first protective layer, and the dielectric breakdown of the dielectric film can be more effectively suppressed.

Furthermore, in the semiconductor device according to the aspect, the first protective layer has a step portion having one or more corner portions, and the first metal film covers at least one of the corner portions.

According to the aspect, the first protective layer has a step portion including one or more corner portions. Therefore, an internal stress is likely to occur in the second protective layer around the corner portion. As a result, the cracks may occur in the second protective layer. However, in the aspect, since the first metal film has relatively high moisture resistance and covers at least one or more corner portions of the first protective layer, the moisture is prevented from entering the dielectric film through the cracks. Accordingly, in the aspect, the dielectric breakdown of the dielectric film is suppressed.

Furthermore, in the semiconductor device according to the aspect, the first metal film straddles the electrode layer disposing portion and the protective layer covering portion.

According to the aspect, since the first metal film is disposed so as to straddle the electrode layer disposing portion and the protective layer covering portion, the moisture can be effectively prevented from entering the first protective layer.

Furthermore, in the semiconductor device according to the aspect, the first metal film extends towards an inner side of the semiconductor device from a boundary between the electrode layer disposing portion and the protective layer covering portion.

According to the aspect, since the first metal film covers at least one corner portion of the first protective layer and is disposed on the inner side from the boundary between the electrode layer disposing portion and the protective layer covering portion, the moisture can be effectively prevented from entering the first protective layer, and occurrence of the creeping discharge on the surface of the protective layer can be effectively prevented.

Furthermore, in the semiconductor device according to the aspect, the first electrode layer has an end portion thereof covered by the first protective layer, and the first metal film is electrically connected to the first electrode layer, and is exposed on a central portion of the first electrode layer.

According to the aspect, the first metal film is further disposed on the central portion of the first electrode layer. Therefore, the first metal film protects the first protective layer against moisture to suppress the dielectric breakdown of the dielectric film. Furthermore, the first metal film is disposed so as to be exposed on the central portion of the first electrode layer. Therefore, the first metal film functions as an external connection electrode in addition to the function of suppressing the dielectric breakdown of the dielectric film.

Furthermore, in the semiconductor device according to the aspect, a third outer peripheral end of the first protective layer is covered by the second protective layer, the first metal film continuously covers the first protective layer other than the third outer peripheral end, and a thickness of the first protective layer is equal to or greater than a thickness of the electrode layer disposing portion of the dielectric film.

According to the aspect, the thickness of the first protective layer is equal to or greater than the thickness of the electrode layer disposing portion of the dielectric film. In such a case, the first protective layer functions as a stress relaxation layer, and suppresses the occurrence of peeling and cracks of the second protective layer due to stress. Accordingly, in the aspect, the moisture can be further prevented from entering the dielectric film through the cracks, and a decrease in the dielectric breakdown strength of the dielectric film can be further suppressed. Furthermore, the first metal film is disposed between the first protective layer and the second protective layer, and continuously covers the first protective layer other than the second outer peripheral end. The first protective layer is doubly covered by the first metal film and the second protective layer that have relatively high moisture resistance. Accordingly, the moisture is prevented from entering the first protective layer and further entering the protective layer covering portion of the dielectric film. In the aspect, it is possible to further suppress the decrease in the dielectric breakdown strength of the dielectric film. Moreover, since the first metal film is disposed between the first protective layer and the second protective layer, the creeping distance of the surface of the protective layer increases, and the creeping discharge on the surface of the protective layer is suppressed.

Furthermore, in the semiconductor device according to the aspect, a second metal film covers the third outer peripheral end of the first protective layer and is separated from the first metal film by a cavity.

According to the aspect, the third outer peripheral end of the first protective layer is covered, and the second metal film separated from the first metal film by the cavity is further provided. That is, the first and second metal films continuously cover the first protective layer except the cavity. Moreover, the first and second metal films, and the first protective layer are covered by the second protective layer. As described above, the first protective layer is doubly covered by the first and second metal films, and the second protective layer that have relatively high moisture resistance. Accordingly, the moisture is prevented from entering the first protective layer and further entering the protective layer covering portion of the dielectric film. In the aspect, it is possible to further suppress the dielectric breakdown of the dielectric film. Furthermore, in the aspect, for example, peeling in the third outer peripheral end of the first protective layer can be effectively prevented as compared with a case in which the first metal film continuously covers the first protective layer except the third outer peripheral end of the first protective layer.

Furthermore, in the semiconductor device according to the aspect, the semiconductor device further includes a diffusion prevention film between the first electrode layer and the first metal film.

According to the aspect, the diffusion prevention film is disposed between the first electrode layer and the first metal film. That is, since the first electrode layer and the first metal film are not in contact with each other, it is possible to prevent a material forming the first electrode layer from diffusing to the first metal film. Accordingly, the semiconductor device can operate stably.

Furthermore, in the semiconductor device according to the aspect, the first electrode layer is formed of polysilicon, the diffusion prevention film is formed of an Al—Si based alloy, and the first metal film is formed of Al.

According to the aspect, polysilicon (more specifically, Si of the polysilicon) forming the first electrode layer is prevented from diffusing to Al forming the first metal film. Accordingly, the semiconductor device can operate stably.

Furthermore, in the semiconductor device according to the aspect, an electrical resistivity of the semiconductor substrate is 0.001 Ωcm to 100 Ωcm.

According to the aspect, a CR element in which the semiconductor substrate functions as a resistor can be manufactured.

Furthermore, in the semiconductor device according to the aspect, the first protective layer is formed of an oxide, and the second protective layer is formed of a nitride.

According to the aspect, the first protective layer is formed of oxide, and the second protective layer is formed of nitride. Therefore, the first protective layer has relatively high dielectric breakdown strength, and the second protective layer has relatively high moisture resistance. Accordingly, in the aspect, both excellent dielectric breakdown strength and excellent moisture resistance are provided.

Furthermore, in the semiconductor device according to the aspect, the first protective layer is formed of an oxide of a main component of the semiconductor substrate, and the second protective layer is formed of a nitride of the main component of the semiconductor substrate.

According to the aspect, the first and second protective layers are formed of oxide and nitride, respectively, as the main component of the semiconductor substrate. Therefore, a close contact among the first main surface of the semiconductor substrate, the first protective layer and the second protective layer is improved.

Furthermore, in the semiconductor device according to the aspect, the semiconductor substrate has a trench on the first main surface thereof, the electrode layer disposing portion of the dielectric film is continuously disposed on the first main surface so as to cover an inner surface of the trench to form a recess, and the first electrode layer has an entering portion that enters the recess.

Since the semiconductor device has a trench structure, an area of an interface between the dielectric film and the first electrode layer increases as compared with a semiconductor device not having the trench structure. As a result, an electric capacitance of the semiconductor device can be increased.

According to the aspect of the present disclosure, the semiconductor device having high moisture resistance and high dielectric breakdown strength can be provided.

DETAILED DESCRIPTION OF THE INVENTION

Hereinafter, a semiconductor device according to an aspect of the present disclosure will be described in detail with reference to the illustrated embodiment. Note that, the drawings include some schematic drawings, and may not reflect an actual dimension and a ratio. Furthermore, the dimension (more specifically, a thickness, a length, a width, and the like) of a constituent element in the semiconductor device were measured based on an SEM image taken by a scanning electron microscope.

First Embodiment

[Configuration]

Figure 1:
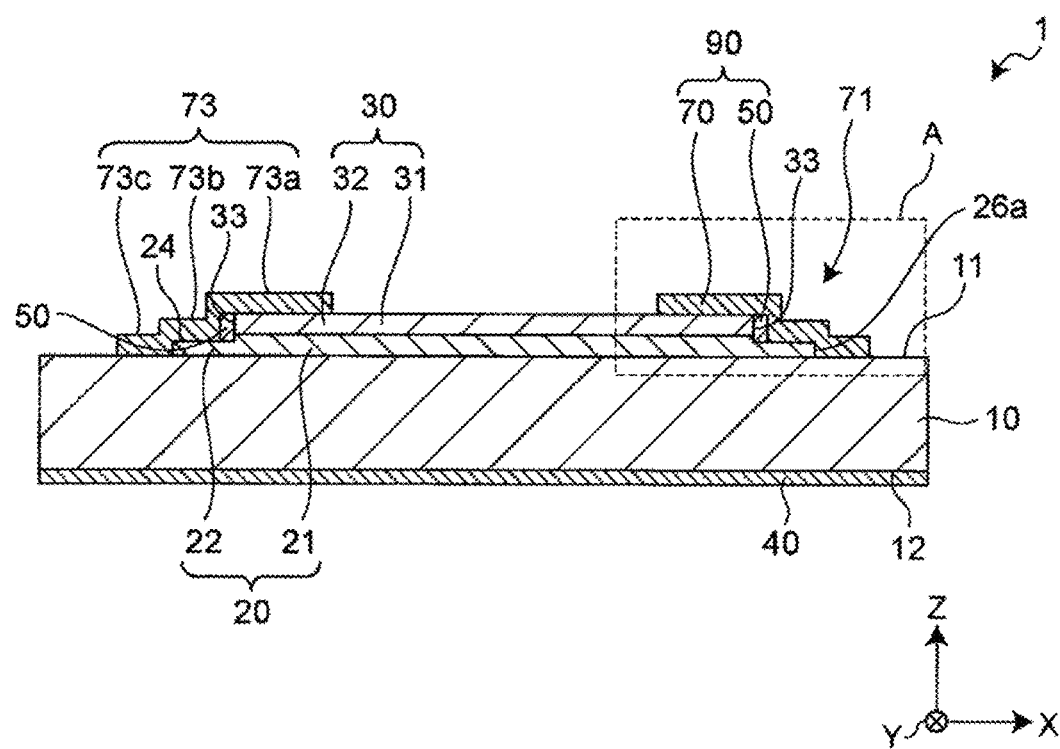
FIG. 1 is a sectional view of a semiconductor device according to a first embodiment.
Figure 2:
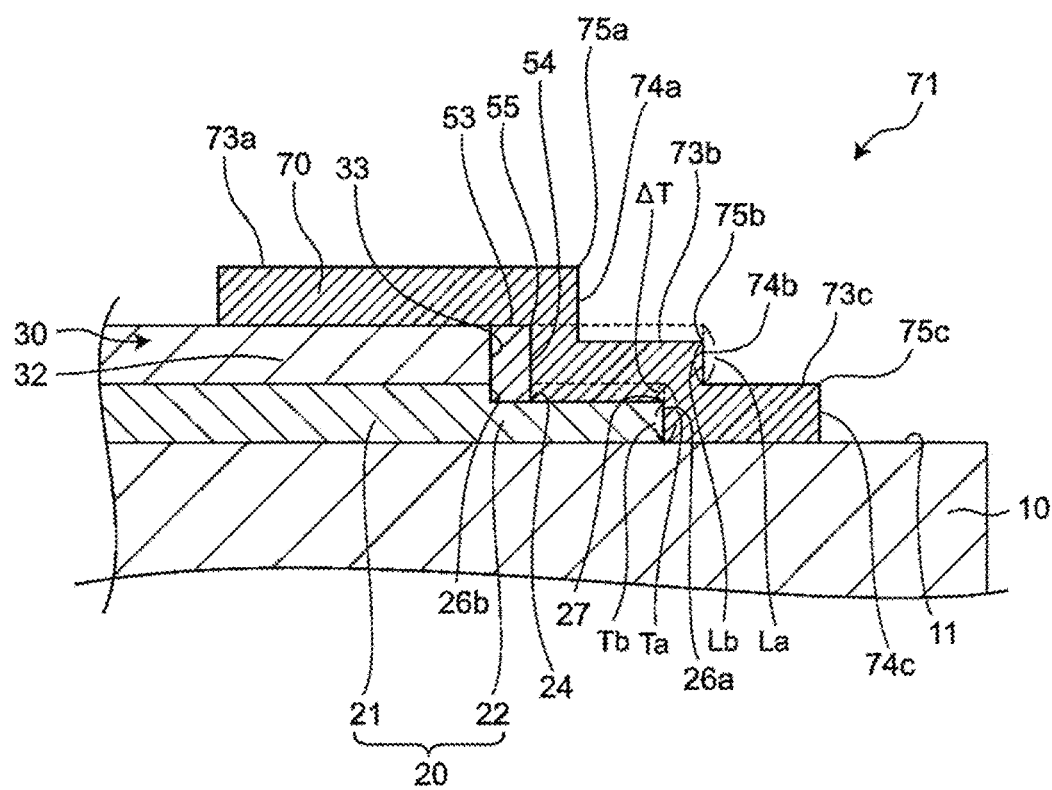
FIG. 2 is an enlarged view of a portion A in FIG. 1.

FIG. 1 is a schematic sectional view of a semiconductor device according to a first embodiment of the present disclosure. FIG. 2 is an enlarged view of a portion A in FIG. 1. As illustrated in FIGS. 1 and 2, the semiconductor device 1 includes a semiconductor substrate 10 having a first main surface 11 and a second main surface 12 opposite each other, a dielectric film 20 disposed on a part of the first main surface 11, a first electrode layer 30 disposed on a part of the dielectric film 20 (on an opposite side to the first main surface 11), and a protective layer 90 continuously covering a portion from an end portion 32 of the first electrode layer 30 to a first outer peripheral end 26a of the dielectric film 20. The dielectric film 20 includes an electrode layer disposing portion 21 on which the first electrode layer 30 is disposed, and a protective layer covering portion 22 covered by the protective layer 90.

Note that, in the drawing, a direction parallel to a thickness direction of the semiconductor device 1 is a Z direction, a forward Z direction is an upper side direction, and an opposite Z direction is a lower side direction. In a plane orthogonal to the Z direction of the semiconductor device 1, a direction parallel to a paper surface on which the drawing is described is an X direction, and a direction orthogonal to the paper surface on which the drawings is described is a Y direction. The X direction, the Y direction, and the Z direction are orthogonal to each other.

In the present specification, the first outer peripheral end 26a of the protective layer covering portion 22 refers to an outer peripheral end of the protective layer covering portion 22 when the protective layer covering portion 22 is viewed from the Z direction. Furthermore, a second outer peripheral end 33 of the first electrode layer 30 to be described later refers to an outer peripheral end of the first electrode layer 30 when the first electrode layer 30 is viewed from the Z direction.

The protective layer 90 includes a first protective layer 50 covering the second outer peripheral end 33 of the first electrode layer 30 and at least a part of the protective layer covering portion 22, and a second protective layer 70 disposed on the first protective layer 50. The first protective layer 50 has a relative permittivity lower than that of the second protective layer 70. Generally, a protective layer having a low relative permittivity has a relatively high dielectric breakdown strength. The second protective layer 70 has moisture resistance higher than that of the first protective layer 50. That is, the protective layer 90 includes the first protective layer 50 having relatively high dielectric breakdown strength (withstand voltage and an electric insulation property) and the second protective layer 70 having relatively high moisture resistance. As described above, the protective layer 90 includes a plurality of layers having different functions (dielectric breakdown strength and the moisture resistance). Accordingly, since the protective layer 90 has functions separated for each layer, the protective layer 90 has both the dielectric breakdown strength and the moisture resistance under a high voltage. On the other hand, unlike the present invention, in a case where the protective layer is formed with a single layer, it is difficult for the protective layer to sufficiently satisfy both the dielectric breakdown strength and the moisture resistance under a high voltage. In a case where the protective layer is formed with a single layer, the protective layer is formed of a single (one type) material, and the dielectric breakdown strength and the moisture resistance may be in a trade-off relationship. One type material is a material excellent in either the dielectric breakdown strength or the moisture resistance, but cannot be excellent in both the dielectric breakdown strength and the moisture resistance.

Furthermore, a thickness of the protective layer covering portion 22 of the dielectric film 20 in the first outer peripheral end 26a is smaller than a thickness of the electrode layer disposing portion 21 of the dielectric film 20. That is, the protective layer covering portion 22 of the dielectric film 20 is understood as a thin film region having a thickness smaller than that of the electrode layer disposing portion 21 in at least the first outer peripheral end 26a. Here, a surface shape of the protective layer 90 stacked on the dielectric film 20 can be determined in accordance with a surface shape of the dielectric film 20 disposed under the protective layer 90. Therefore, by forming the protective layer covering portion 22 of the dielectric film 20 as a thin film region, a step of a step portion 71 of the second protective layer 70 (more specifically, a length Lb of a second side surface 74b to be described later), which corresponds to the first outer peripheral end 26a of the dielectric film 20, is set to be small as compared with a case where a thickness of the protective layer covering portion is the same as a thickness of the electrode layer disposing portion. As a result, occurrence of cracks can be suppressed in the vicinity of a corner portion of the step portion 71 of the second protective layer 70 (more specifically, a second corner portion 75b to be described later) which corresponds to the first outer peripheral end 26a of the dielectric film 20.

More specifically, a thickness Tb of the protective layer covering portion 22 of the dielectric film 20 in the first outer peripheral end 26a is smaller than a thickness Ta of the electrode layer disposing portion 21 of the dielectric film 20 by ΔT (=Ta−Tb). That is, the protective layer covering portion 22 has an upper surface 24 that is lower by ΔT at least in the first outer peripheral end 26a as compared with a case where the thin film region is not formed.

Since a surface shape of the second protective layer 70 can be determined in accordance with a surface shape of the protective layer covering portion 22 of the dielectric film 20 under the second protective layer 70, the surface shape of the second protective layer 70 corresponds to a surface shape of the protective layer covering portion 22 of the dielectric film 20 and is substantially the same as the surface shape of the protective layer covering portion 22. Therefore, a second upper surface 73b of the second protective layer 70 is lower by ΔT at least in the first outer peripheral end 26a as compared with a case where the protective layer covering portion 22 of the dielectric film 20 is not formed as a thin film region.

That is, a length Lb of a second side surface 74b of the second protective layer 70 corresponds to the thickness Tb, and a length La of the second side surface 74b in a case where the protective layer covering portion 22 of the dielectric film 20 is not formed as a thin film region corresponds to the thickness Ta. Therefore, Lb is shorter than La by ΔT (note that, in FIG. 2, a case where La is the same as the thickness of the first electrode layer 30, in other words, a case where the thickness of the electrode layer disposing portion 21 is the same as the thickness of the first electrode layer 30 is illustrated, but the present embodiment is not limited thereto). A second step understood as the second side surface 74b between the second upper surface 73b and a third upper surface 73c which is one step down from the second upper surface 73b is smaller as compared with a case where the entire protective layer covering portion 22 of the dielectric film 20 is not formed as a thin film region. As a result, a ratio of the second step in the step portion 71 of the second protective layer 70 decreases. Since the ratio of the second step in the step portion 71 decreases, an internal stress generated in the second protective layer 70 decreases around a second corner portion 75b corresponding to a corner portion 27 of the protective layer covering portion 22.

Accordingly, in the second protective layer 70 around the second corner portion 75b formed by the second upper surface 73b and the second side surface 74b of the second protective layer 70, the internal stress generated in the second protective layer 70 around the second corner portion 75b is decreased around the second corner portion 75b by shortening the length Lb of the second side surface 74b. Accordingly, the occurrence of the cracks in the second protective layer 70 around the second corner portion 75b is suppressed. Furthermore, the occurrence of the cracks is suppressed in the second protective layer 70 around the corner portion 27 (corresponding to the second corner portion 75b).

In the second protective layer 70, cracks occur in the step portion 71, and more specifically, in the vicinity of a corner portion in which a stress is likely to concentrate (in the aspect illustrated in the drawing, a first corner portion 75a, the second corner portion 75b, and a third corner portion 75c), typically, the cracks tend to occur in the corner portion as a starting point. Among these cracks of the second protective layer 70, moisture (more specifically, moisture in the atmosphere) is considered to easily enter the dielectric film 20 through the cracks occurred in the vicinity of the corner portion (second corner portion 75b in the aspect illustrated in the FIG. 2) corresponding to the first outer peripheral end 26a of the dielectric film 20. In other words, when the occurrence of the cracks in the vicinity of the corner portion (second corner portion 75b) of the step portion 71 of the second protective layer 70, which corresponds to the first outer peripheral end 26a of the dielectric film 20, can be suppressed, the moisture can be effectively prevented from entering the dielectric film 20, and furthermore, deterioration in a withstand voltage of the dielectric film 20 can be effectively suppressed.

According to the semiconductor device 1 of the present embodiment, as described above, the occurrence of the cracks can be suppressed in the vicinity of the corner portion of the step portion 71 of the second protective layer 70 (second corner portion 75b), which corresponds to the first outer peripheral end 26a of the dielectric film 20. Accordingly, in the semiconductor device 1, the moisture (more specifically, moisture in the atmosphere) is prevented from entering the dielectric film 20 through the cracks of the second protective layer 70. Therefore, in the present embodiment, a decrease in the dielectric breakdown strength of the dielectric film 20 (deterioration in the withstand voltage of the dielectric film) is suppressed.

Moreover, the first protective layer 50 has a relative permittivity lower than that of the second protective layer 70, furthermore, has a dielectric breakdown strength higher than that of the second protective layer 70, and continuously covers the second outer peripheral end 33 of the first electrode layer 30 and at least a part of the protective layer covering portion 22. Therefore, dielectric breakdown between the second outer peripheral end 33 of the first electrode layer 30 and the first main surface 11 of the semiconductor substrate 10 can be suppressed, and a decrease in the dielectric breakdown strength of the dielectric film 20 can be suppressed.

(Semiconductor Device)

Since the semiconductor device 1 can suppress the decrease in the dielectric breakdown strength of the dielectric film 20 as described above, the semiconductor device 1 can operate when a high voltage of 100 V or higher (more specifically, a high voltage of 600 V or higher) is applied. That is, the semiconductor device 1 has a withstand voltage that can withstand a rated voltage of 100 V or higher and a rated voltage of 600 V or higher.

The semiconductor device 1 is, for example, a capacitor. The semiconductor device 1 is used, for example, as a decoupling capacitor (bypass capacitor) of a high-frequency digital circuit, and is used for electronic devices such as a personal computer, a DVD player, a digital camera, a TV, a mobile phone, car electronics, and medical, industrial, and communication machines. However, an application of the semiconductor device 1 is not limited thereto, and for example, the semiconductor device 1 can also be used for a filter circuit, a rectifying and smoothing circuit, and the like.

The semiconductor device 1 may further include a second electrode layer 40 disposed on the second main surface 12 of the semiconductor substrate 10. In the aspect illustrated in the drawing, the first electrode layer 30 and the second electrode layer 40, which function as external connection electrodes, are disposed to face each other with the semiconductor substrate 10 interposed therebetween. Note that, the semiconductor device 1 may further include an external connection electrode electrically connected to each of the first electrode layer 30 and the second electrode layer 40. In the semiconductor device 1, the first electrode layer 30 and the second electrode layer 40 (alternatively, the external connection electrode, in a case where it is present) can be electrically connected to a wiring of a circuit board (not illustrated) by wires or solder bumps.

However, the second electrode layer 40 may be disposed between the semiconductor substrate 10 and the dielectric film 20. At this time, the first electrode layer 30 functioning as an external connection electrode and the external connection electrode electrically connected to the second electrode layer 40 may be disposed on the same XY plane so as to be separated from each other.

(Semiconductor Substrate)

The semiconductor substrate 10 has the first main surface 11 and the second main surface 12 opposite each other. The sectional shape of the semiconductor substrate 10 is substantially rectangular as illustrated in FIG. 1.

A material of the semiconductor substrate 10 may be, for example, any of silicon (Si), SiC, and GaN. The semiconductor substrate 10 can be doped with an impurity (dopant) for the purpose of adjusting conductivity or the like. The dopant (donor) that supplies electrons is, for example, an element of Group 15 (more specifically, phosphorus or the like). The dopant (acceptor) that supplies holes is an element of Group 13 (more specifically, boron and the like). The semiconductor substrate 10 may be an n-type semiconductor substrate or a p-type semiconductor substrate. An electrical resistivity of the semiconductor substrate 10 is, for example, 0.001 Ωcm to 100 Ωcm. When the electrical resistivity of the semiconductor substrate 10 is within the above numerical range, a CR element (capacitor-resistor composite element) in which the semiconductor substrate 10 functions as a resistor can be manufactured from the semiconductor device 1.

A thickness of the semiconductor substrate 10 is, for example, 100 μm to 700 μm.

Note that, in the present specification, the thickness thereof refers to a length in the Z direction.

(Dielectric Film)

The dielectric film 20 is disposed on a part of the first main surface 11. The dielectric film 20 includes the electrode layer disposing portion 21 on which the first electrode layer 30 is disposed, and a protective layer covering portion 22 covered by the protective layer 90 (second protective layer 70 and the first protective layer 50).

The electrode layer disposing portion 21 of the dielectric film 20 mainly adjusts an electric capacitance. The protective layer covering portion 22 of the dielectric film 20 mainly secures electric insulation property between the semiconductor substrate 10 and the first electrode layer 30.

A material of the dielectric film 20 is, for example, a Si-based material (more specifically, silicon oxide (SiO$_2$) or the like). The dielectric film 20 is preferably formed of silicon oxide. When the dielectric film 20 is formed of the silicon oxide, the electric capacitance of the semiconductor device 1 can be increased.

The thickness Tb of the protective layer covering portion 22 of the dielectric film 20 in the first outer peripheral end 26a is smaller than the thickness Ta of the electrode layer disposing portion 21 of the dielectric film 20. The thickness Ta of the electrode layer disposing portion 21 of the dielectric film 20 is, for example, 0.1 μm to 3 μm.

A sectional shape of the protective layer covering portion 22 of the dielectric film 20 may be, for example, a substantially rectangular shape as illustrated in FIGS. 1 and 2. In other words, in the configuration illustrated in FIGS. 1 and 2, the dielectric film 20 has a thin film region in the entire protective layer covering portion 22. However, in the present invention, the thickness of the protective layer covering portion 22 in the first outer peripheral end 26a only needs to be smaller than the thickness of the electrode layer disposing portion 21, and the protective layer covering portion 22 may have a sectional shape that gradually becomes thinner (for example, continuously or in a step shape) from the electrode layer disposing portion 21 side toward the first outer peripheral end 26a. More specifically, the minimum thickness of the electrode layer disposing portion 21 is equal to or greater than the maximum thickness of the protective layer covering portion 22. For example, the thickness of the protective layer covering portion 22 in the first outer peripheral end 26a may be substantially zero. The protective layer covering portion 22 (thin film region) of the dielectric film 20 is formed by, for example, over-etching as will be described later in the method for manufacturing the semiconductor device 1. When the upper surface 24 of the protective layer covering portion 22 of the dielectric film 20 is formed by the over-etching, the upper surface 24 becomes rough as compared with a case where the upper surface 24 is formed by a method other than the over-etching. Therefore, a contact area of the upper surface 24 of the protective layer covering portion 22 of the dielectric film 20 with the protective layer 90 increases, and a close contact with the protective layer 90 is improved.

A width (length of the upper surface 24) of the protective layer covering portion 22 of the dielectric film 20 is, for example, 30 μm or less. When a length of the protective layer covering portion 22 of the dielectric film 20 is 30 μm or less, insulation between an end surface (second outer peripheral end 33) of the first electrode layer 30 and the first main surface 11 is improved. The width of the protective layer covering portion 22 is greater than the thickness of the protective layer covering portion 22.

(First Electrode Layer)

The first electrode layer 30 forms an electric field with the second electrode layer 40. The first electrode layer 30 is disposed on the electrode layer disposing portion 21 which is a part of the dielectric film 20. The first electrode layer 30 faces the second electrode layer 40 with the dielectric film 20 and the semiconductor substrate 10 interposed therebetween. The first electrode layer 30 has the end portion 32 covered by the protective layer 90 and a central portion 31. Since the central portion 31 is not covered by the protective layer 90 and exposed, the central portion 31 also functions as an external connection electrode. For example, the first electrode layer 30 can be electrically connected to the circuit board by wires or solder bumps.

A material of the first electrode layer 30 is, for example, metal or another conductive material (more specifically, a conductive resin, polysilicon, or the like). Examples of the metal include molybdenum (Mo), aluminum (Al), gold (Au), tungsten (W), platinum (Pt), titanium (Ti), and an alloy thereof. The first electrode layer 30 can have a plurality of layers formed of these metals. Furthermore, among these metals, the material of the first electrode layer 30 are preferably the metal or polysilicon, and more preferably Al or polysilicon, from the viewpoint of increasing conductivity and moisture resistance. That is, the first electrode layer 30 is preferably formed of polysilicon or Al. Increasing the moisture resistance of the first electrode layer 30 means, for example, preventing the moisture from entering the dielectric film 20 through the first electrode layer 30 with the first electrode layer 30 formed of polysilicon or Al, and suppressing a decrease in insulation strength.

(Second Electrode Layer)

The second electrode layer 40 can be disposed on the second main surface 12 of the semiconductor substrate 10. Since a lower surface of the second electrode layer 40 is exposed, the second electrode layer 40 also functions as an external connection electrode. For example, the second electrode layer 40 can be electrically connected to the circuit board by a wire or a solder bump. A material of the second electrode layer 40 is, for example, metal or another conductive material (more specifically, a conductive resin, polysilicon (polycrystal silicon), or the like). Examples of the metal include molybdenum (Mo), aluminum (Al), gold (Au), tungsten (W), platinum (Pt), nickel (Ni), titanium (Ti), and an alloy thereof. The second electrode layer 40 may be a multilayer metal film. The multilayer metal film can have a plurality of layers formed of these metals. The multilayer metal film is, for example, the second electrode layer including a Ti layer, a Ni layer, and an Au layer. Note that, the second electrode layer 40 may be disposed between the semiconductor substrate 10 and the dielectric film 20.

(Protective Layer)

The protective layer 90 continuously covers a portion from the end portion 32 of the first electrode layer 30 to the first outer peripheral end 26a of the dielectric film 20. That is, the protective layer 90 continuously covers the end portion 32 of the first electrode layer 30 and the protective layer covering portion 22 of the dielectric film 20 in a range from the end portion 32 of the first electrode layer 30 to the first outer peripheral end 26a of the dielectric film 20, and a part of the first main surface 11 of the semiconductor substrate 10 without interruption. The protective layer 90 includes the first protective layer 50 and the second protective layer 70 disposed on the first protective layer 50.

(First Protective Layer)

The first protective layer 50 continuously covers the second outer peripheral end 33 of the first electrode layer 30, a fourth outer peripheral end 26b of the dielectric film 20, and a part of the upper surface 24 of the protective layer covering portion 22 of the dielectric film 20 without interruption. That is, the first protective layer 50 continuously covers the second outer peripheral end 33 of the first electrode layer 30 and at least a part of the protective layer covering portion 22 of the dielectric film 20. As described above, by providing the first protective layer 50 having a relatively high dielectric breakdown strength in a space between the second outer peripheral end 33 of the first electrode layer 30 and the upper surface 24 of the protective layer covering portion 22 of the dielectric film 20, discharge such as a short circuit between the second outer peripheral end 33 of the first electrode layer 30 and the first main surface 11 of the semiconductor substrate 10 can be prevented. Therefore, in the present embodiment, the dielectric breakdown strength of the semiconductor device 1 is improved.

A thickness of the first protective layer 50 is, for example, 0.1 µm to 3 µm. When the thickness of the first protective layer 50 is 0.1 µm to 3 µm, occurrence of the discharge between the first main surface 11 of the semiconductor substrate 10 and the first electrode layer 30 can be further prevented, and the dielectric breakdown strength of the semiconductor device 1 is improved. The thickness of the first protective layer 50 can be equal to or greater than the thickness of the electrode layer disposing portion 21 of the dielectric film 20.

The first protective layer 50 has a relative permittivity lower than that of the second protective layer 70, and preferably has a relative permittivity equal to or lower than that of the dielectric film 20. The relative permittivity can be measured in accordance with JIS C2138. The lower the relative permittivity, the higher the dielectric breakdown strength can be. Such a material of the first protective layer 50 is, for example, a material having a relatively low relative permittivity. Among them, the material of the first protective layer 50 is preferably oxide, and oxide (more specifically, silicon oxide ($SiO_2$)) as a main component of the semiconductor substrate 10 to be described later. That is, the first protective layer 50 is preferably formed of a material having a relatively low relative permittivity, more preferably formed of oxide, and still more preferably formed of oxide (more specifically, silicon oxide ($SiO_2$)) as a main component of the semiconductor substrate 10. When the first protective layer 50 is formed of oxide, the dielectric breakdown strength of the semiconductor device 1 is improved.

(Second Protective Layer)

The second protective layer 70 continuously covers the end portion 32 of the first electrode layer 30, an upper surface 53 and a side surface 54 of the first protective layer 50, the upper surface 24 and the first outer peripheral end 26a of the protective layer covering portion 22 of the dielectric film 20, and a part of the first main surface 11 of the semiconductor substrate 10 without interruption. That is, the second protective layer 70 continuously covers a portion from the end portion 32 of the first electrode layer 30 to a part of the first main surface 11 of the semiconductor substrate 10. The second protective layer 70 mainly protects the protective layer covering portion 22. The second protective layer 70 prevents the moisture from entering the protective layer covering portion 22. Furthermore, the second protective layer 70 suppresses occurrence of creeping discharge (and optionally air discharge) between an exposed portion of the first electrode layer 30 (or the external connection electrode when present) and an exposed portion of the semiconductor substrate 10 (more specifically, the first main surface 11).

The second protective layer 70 has the step portion 71 in which an upper surface 73 (first to third upper surfaces 73a to 73c) is lowered in a step shape. The step portion 71 of the second protective layer 70 is configured to have the upper surface 73, and a side surface 74, and a corner portion 75, more specifically, three pairs of first to third upper surfaces 73a to 73c and first to third side surfaces 74a to 74c, and first to third corner portions 75a to 75c. In the aspect illustrated in the drawing, the step portion 71 has, on the surface of the second protective layer 70, the first upper surface 73a and the first side surface 74a that form the first corner portion 75a, the second upper surface 73b and the second side surface 74b that form the second corner portion 75b, and the third upper surface 73c and the third side surface 74c that form the third corner portion 75c. In other words, the step portion 71 has a first step (corresponding to the first side surface 74a) between the first upper surface 73a and the second upper surface 73b, a second step (corresponding to the second side surface 74b) between the second upper surface 73b and the third upper surface 73c, and a third step (corresponding to the third side surface 74c) between the third upper surface 73c and the first main surface 11, and is formed to be sequentially lowered in a step shape on the surface of the second protective layer 70.

For each step, the shape of the upper surface and the side surface that form the step, and the shape of the corner portion formed by the upper surface and the side surface are not limited to the form (sectional shape) illustrated in the drawing. A plurality of the upper surfaces present may be parallel to each other (straight lines parallel to each other in the sectional view), but are not limited thereto, and in practice, may be inclined, curved, or uneven. Furthermore, a plurality of the side surfaces present may be parallel to each other, but are not limited thereto, and in practice, may be inclined, curved, or uneven. A pair of the upper surface and the side surface that form any corner portion present may each be connected substantially perpendicularly (about 90°) or at an angle other than substantially perpendicular angle (about 90°). Any of a plurality of the corner portions present may have a substantially perpendicular angle (about 90°), but is not limited thereto, and in practice, may be rounded or partially cut. Note that, in the present specification, "substantially vertical (about 90°)" and "substantially perpendicular angle (about 90°)" are not limited to 90°, and include an angle around 90° in consideration of a realistic variation range. An "angle other than substantially perpendicular angle (about 90°)" may be any suitable angle that exceeds the realistic variation range.

A thickness of the second protective layer 70 is, for example, 0.1 µm to 3 µm. When the thickness of the second protective layer 70 is 0.1 µm to 3 µm, the moisture resistance of the second protective layer 70 is improved, and the moisture is further prevented from reaching the protective layer covering portion 22. Here, the thickness of the second protective layer 70 is not the thickness around the corner portion 55, but is, for example, a length in the Z direction between the first upper surface 73a of the second protective layer 70 and the upper surface of the first electrode layer 30, a length in the Z direction between the second upper surface 73b of the second protective layer 70 and the upper surface 24 of the protective layer covering portion 22 of the dielectric film 20, and a length in the Z direction between the third upper surface 73c of the second protective layer 70 and the first main surface 11 of the semiconductor substrate 10. The thickness of the second protective layer 70 can be equal to or greater than the thickness of the electrode layer disposing portion 21 of the dielectric film 20.

The second protective layer 70 has moisture resistance higher than that of the first protective layer 50, and preferably has moisture resistance higher than that of the dielectric film 20. Various measurement methods for the moisture resistance are known, but the moisture resistance of the second protective layer 70, the first protective layer 50, and the dielectric film 20 can be relatively evaluated by evaluating the second protective layer 70, the first protective layer 50, and the dielectric film 20 by the same measurement method under the same conditions. A material of the second protective layer 70 is selected from materials having moisture resistance higher than that of the first protective layer 50. The material of the second protective layer 70 is, for example, nitride, and preferably nitride (more specifically, silicon nitride (SiN)) as a main component of the semiconductor substrate 10 to be described later. That is, the second protective layer 70 is preferably formed of nitride, and more preferably formed of nitride (more specifically, silicon oxide) as a main component of the semiconductor substrate 10. When the second protective layer 70 is formed of the nitride, the dielectric film 20 is provided on the first main surface 11 of the semiconductor substrate 10, an upper surface of the electrode layer disposing portion 21 is covered by the first electrode layer 30, a part of the protective layer covering portion 22 is indirectly covered by the second protective layer 70 with the end portion 32 of the first electrode layer 30 and the first protective layer 50 interposed therebetween, and the remaining part of the protective layer covering portion 22 is directly covered by the second protective layer 70, and thus an outer surface of the dielectric film 20 is covered with a material having moisture resistance higher than that of the dielectric film 20. Accordingly, the moisture is prevented from entering the dielectric film 20, and thus the moisture resistance of the semiconductor device 1 is improved.

[Method for Manufacturing Semiconductor Device]

Next, an example of a method for manufacturing the semiconductor device 1 will be described.

The method for manufacturing the semiconductor device 1 includes: a dielectric film forming step of forming the dielectric film 20 (more specifically, including the electrode layer disposing portion 21 and a portion to be the protective layer covering portion 22 later, which are precursors of the dielectric film 20 described above with reference to FIGS. 1 to 2) on a part of the first main surface 11 of the semiconductor substrate 10; a first electrode layer forming step of forming the first electrode layer 30 on a part of the dielectric film 20 and removing a part of the dielectric film 20 to form the protective layer covering portion 22 (thin film region) (thereby, the dielectric film 20 including the electrode layer disposing portion 21 and the protective layer covering portion 22 is formed); a first protective layer forming step of forming the first protective layer 50 continuously covering the second outer peripheral end 33 of the first electrode layer 30 and the fourth outer peripheral end 26b of the dielectric film 20; a second protective layer forming step of forming the second protective layer 70 continuously covering a portion from the end portion 32 of the first electrode layer 30 to the first main surface 11; and a second electrode layer forming step of forming the second electrode layer 40 on the second main surface 12 of the semiconductor substrate 10.

The method for manufacturing the semiconductor device 1 can further include a dicing step of segmenting a structure (mother integrated body) having a plurality of semiconductor device structures obtained above with a dicing machine.

Specifically, with reference to FIGS. 3A to 3F, an example of the method for manufacturing the semiconductor device 1 will be described. FIGS. 3A to 3F are views illustrating the method for manufacturing the semiconductor device 1. The method for manufacturing the semiconductor device 1 includes the dielectric film forming step, the first electrode layer forming step, the first protective layer forming step, the second protective layer forming step, the second electrode layer forming step, and the dicing step. Note that, a mother integrated body in which the semiconductor devices 1 are integrated is manufactured with the steps from the dielectric film forming step to the second electrode layer forming step, but the manufacturing method will be described by focusing on one semiconductor device 1 for convenience of description.

(Dielectric Film Forming Step)

Figure 3A:
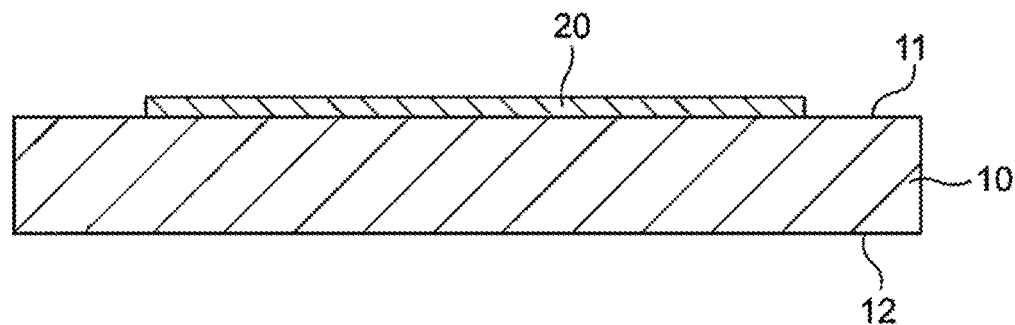
FIG. 3A is an explanatory view illustrating a method for manufacturing a semiconductor device.

In the dielectric film forming step, as illustrated in FIG. 3A, the dielectric film 20 is formed on a part of the first main surface 11 of semiconductor substrate 10. In the dielectric film forming step, for example, the dielectric film 20 is formed on the first main surface 11 of the semiconductor substrate 10, and the dielectric film 20 is patterned. Specifically, a silicon substrate is prepared as the semiconductor substrate 10. For example, the dielectric film 20 formed of $SiO_2$ is formed to have a thickness of 0.1 µm to 3 µm on the first main surface 11 of the semiconductor substrate 10 by using a chemical vapor deposition method (CVD method).

Next, the dielectric film 20 formed on the first main surface 11 of the semiconductor substrate 10 is patterned by a photolithography method and a dry etching method. For example, in the photolithography method, a liquid resist is spincoated to form a photoresist film on the dielectric film 20. The photoresist film is exposed through a mask corresponding to a predetermined pattern. The exposed photoresist film is developed. In the dry etching method, for example, the dielectric film 20 not covered with the photoresist film is selectively removed by using reactive ion etching (RIE). Thereafter, the photoresist film is removed. Accordingly, the dielectric film 20 (more specifically, including the electrode layer disposing portion 21 and a portion to be the protective layer covering portion 22 later, which are precursors of the dielectric film 20 described above with reference to FIGS. 1 to 2) having a predetermined pattern is formed on the first main surface 11 of the semiconductor substrate 10.

(First Electrode Layer Forming Step)

Figure 3B:
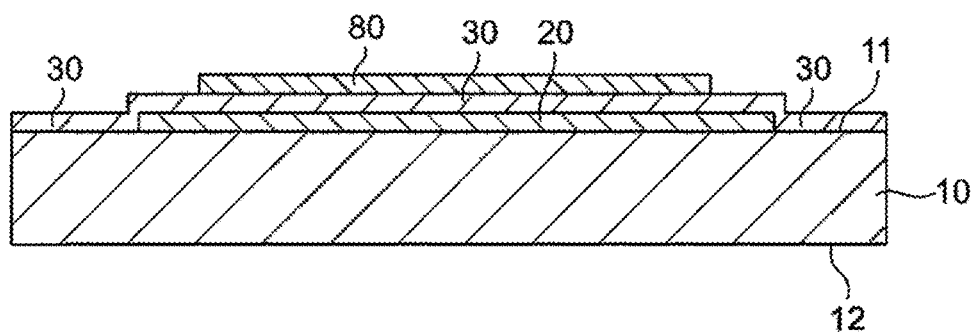
FIG. 3B is an explanatory view illustrating a method for manufacturing a semiconductor device.
Figure 3C:
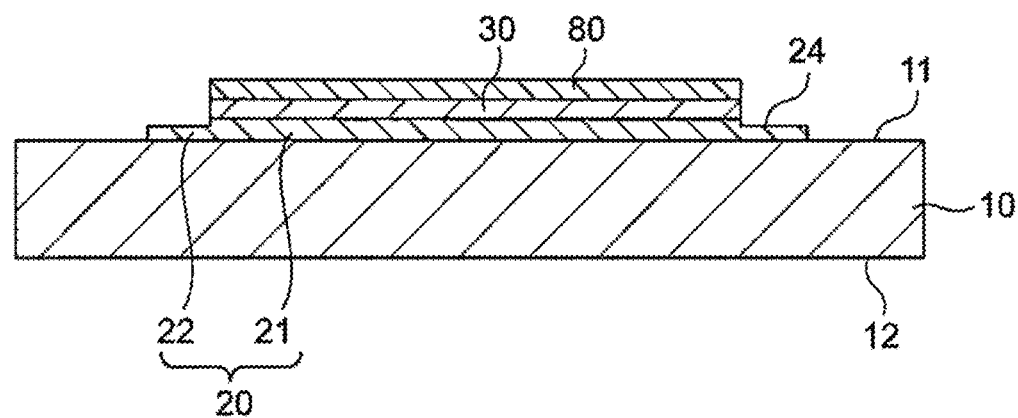
FIG. 3C is an explanatory view illustrating a method for manufacturing a semiconductor device.

In the first electrode layer forming step, as illustrated in FIGS. 3B and 3C, the first electrode layer 30 is formed on a part of the dielectric film 20, and a part of the dielectric film 20 is removed to form the protective layer covering portion 22 (thin film region). In the first electrode layer forming step, for example, the first electrode layer 30 is formed on the first main surface 11 of the semiconductor substrate 10 on which the dielectric film 20 is disposed, and the first electrode layer 30 is patterned. Specifically, as illustrated in FIG. 3B, the first electrode layer 30 formed of Al, for example, is formed so as to have a thickness of 0.1 µm to 3 µm on the first main surface 11 of semiconductor substrate 10 on which the dielectric film 20 is disposed by using a sputtering method or a vacuum vapor deposition method.

Next, the first electrode layer 30 is patterned by the photolithography method and the dry etching method. Specifically, as illustrated in FIG. 3B, a mask layer (more specifically, the photoresist layer) 80 is patterned and formed on the first electrode layer 30. Next, as illustrated in FIG. 3C, the first electrode layer 30 is patterned. In the patterning of the first electrode layer 30, the unnecessary first electrode layer 30 that does not form a desired pattern is removed. Moreover, a part of the dielectric film 20 is also removed by the over-etching. Next, the mask layer 80 is removed. Accordingly, the first electrode layer 30 having a predetermined pattern is formed, and the protective layer covering portion 22 (thin film region) of the dielectric film 20 is formed.

Since the upper surface 24 of the protective layer covering portion 22 of the dielectric film 20 is formed by the etching processing, the upper surface 24 becomes rough as compared with a case where the etching processing is not performed. When the upper surface 24 becomes rough, a contact area between the upper surface 24 and the first and second protective layers 50 and 70 which are formed in the subsequent first and second protective layer forming steps increases, and a close contact between the protective layer covering portion 22 of the dielectric film 20 and the first and second protective layers 50 and 70 is improved.

(First Protective Layer Forming Step)

Figure 3D:
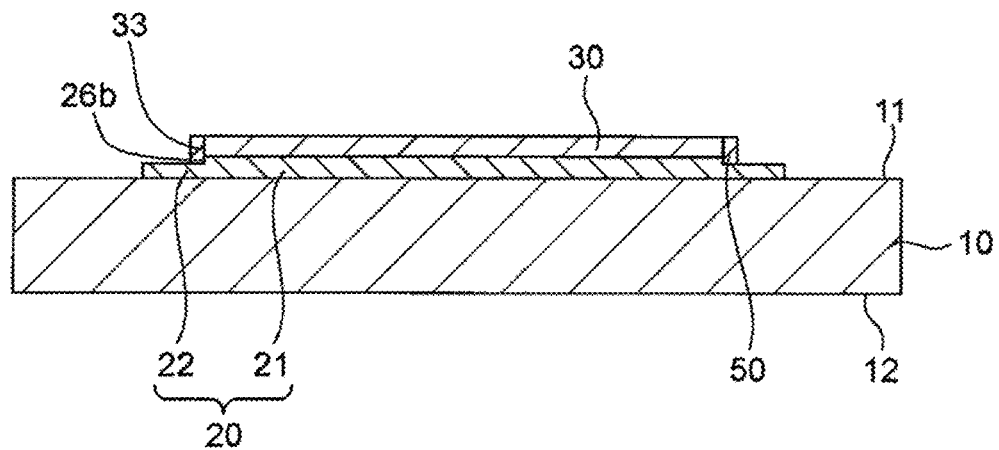
FIG. 3D is an explanatory view illustrating a method for manufacturing a semiconductor device.

In the first protective layer forming step, as illustrated in FIG. 3D, the first protective layer 50 that continuously covers the second outer peripheral end 33 of first electrode layer 30 and the fourth outer peripheral end 26b of the dielectric film 20 is formed. Specifically, for example, the first protective layer 50 formed of SiO$_2$ is formed by using the CVD method, and patterning is performed by using the photolithography method and the dry etching method. The first protective layer 50 is formed as described above. Furthermore, the first protective layer 50 is formed to have a thickness of 0.1 µm to 3 µm. Accordingly, the first protective layer 50 is formed.

(Second Protective Layer Forming Step)

Figure 3E:
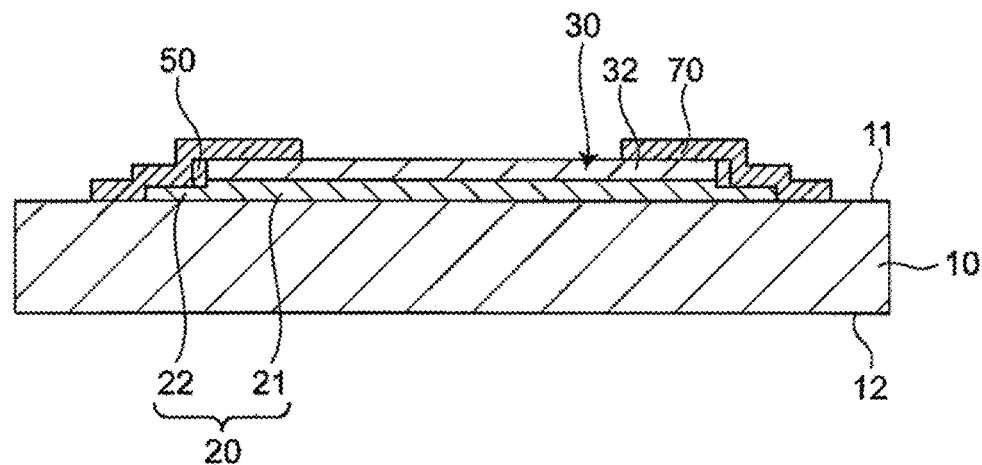
FIG. 3E is an explanatory view illustrating a method for manufacturing a semiconductor device.

In the second protective layer forming step, as illustrated in FIG. 3E, the second protective layer 70, which continuously covers a portion from the end portion 32 of the first electrode layer 30 to the first main surface 11 of the semiconductor substrate 10, is formed. Specifically, for example, the second protective layer 70 formed of SiN is formed by using the CVD method, and patterning is performed by using the photolithography method and a wet etching method. The second protective layer 70 is formed as described above. Furthermore, the second protective layer 70 is formed to have a thickness of 0.1 µm to 3 µm. Accordingly, the second protective layer 70 is formed.

(Second Electrode Layer Forming Step)

Figure 3F:
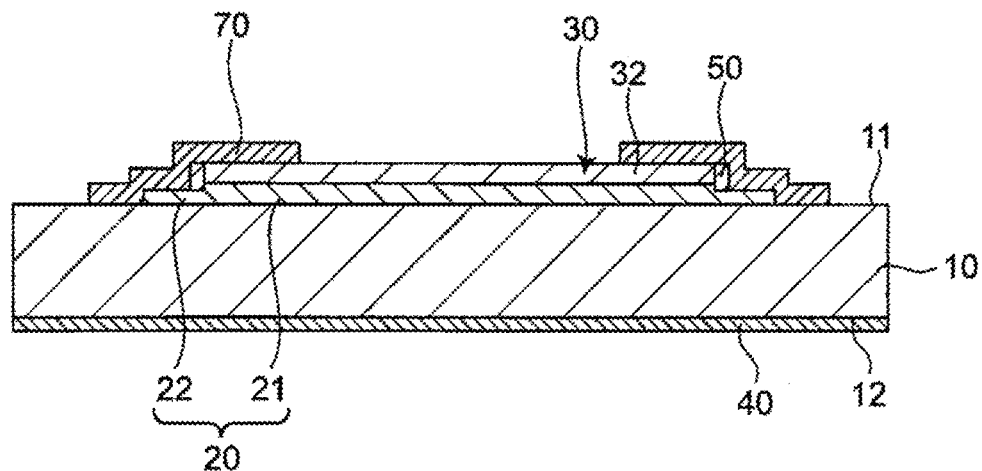
FIG. 3F is an explanatory view illustrating a method for manufacturing a semiconductor device.

In the second electrode layer forming step, as illustrated in FIG. 3F, the second electrode layer 40 is formed on the second main surface 12 of the semiconductor substrate 10. Specifically, in the second electrode layer forming step, the Ti layer, the Ni layer, and the Au layer are sequentially formed on the second main surface 12 of the semiconductor substrate 10 by using, for example, the sputtering method and the vacuum vapor deposition method. Accordingly, a multilayer metal film including three layers is formed. The obtained multilayer metal film forms the second electrode layer 40 including three layers obtained by stacking the Ti layer, Ni layer, and the Au layer in this order from the semiconductor substrate 10 side. In this way, a mother stacked body is obtained. In the second electrode layer forming step, before the second electrode layer 40 is formed on the second main surface 12, the second main surface 12 may be ground or subjected to grinding processing.

(Dicing Step)

In the dicing step, the mother stacked body is segmented with the dicing machine to manufacture the semiconductor device 1.

Second Embodiment

[Configuration]

Figure 4:
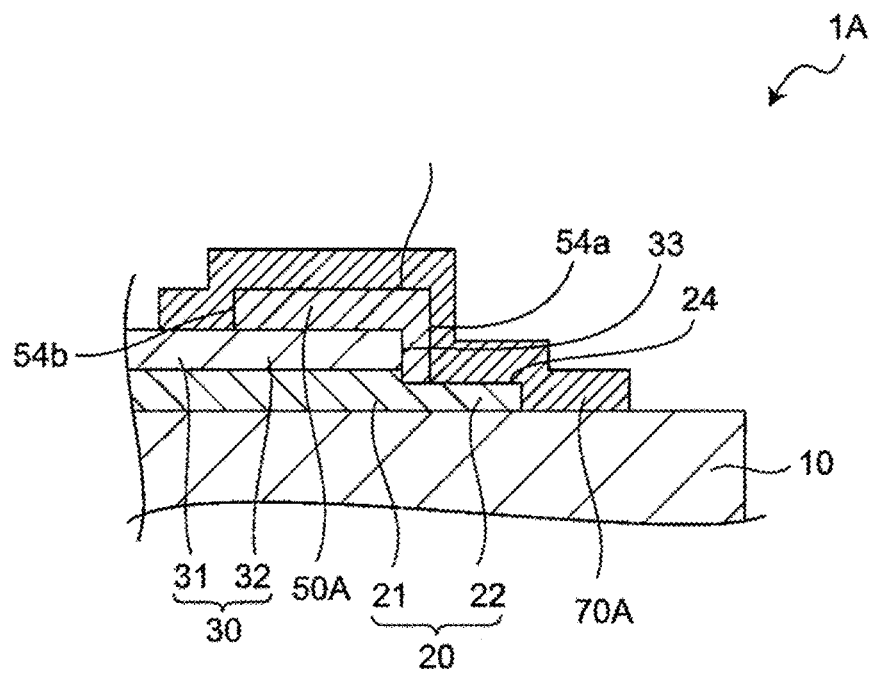
FIG. 4 is an enlarged partial sectional view of a semiconductor device according to a second embodiment.

FIG. 4 is a schematic enlarged sectional view of a semiconductor device 1A according to a second embodiment. The second embodiment is a modified example of the first embodiment, and is different from the first embodiment in terms of an arrangement place of the first protective layer. This different configuration will be described below. Note that, in the second embodiment, the same reference numerals as those in the first embodiment indicate the same configurations as those in the first embodiment, and thus the description thereof will be omitted.

As illustrated in FIG. 4, in the semiconductor device 1A according to the second embodiment, a first protective layer 50A continuously covers a portion from the end portion 32 of the first electrode layer 30 to at least a part of the protective layer covering portion 22 of the dielectric film 20. That is, the first protective layer 50A continuously covers the end portion 32 and the second outer peripheral end 33 of the first electrode layer 30, and the first outer peripheral end 26a and a part of the upper surface 24 of the dielectric film 20 without interruption. In this manner, the first protective layer 50A further covers the end portion 32 of the first electrode layer 30. That is, the first protective layer 50A has a relative permittivity lower than that of a second protective layer 70A, and a creeping distance of the surface of the protective layer 90 between the first electrode layer 30 and the semiconductor substrate 10, more specifically, a distance of the surface of the second protective layer 70A between an exposed portion of the first electrode layer 30 (portion not covered by the second protective layer 70A) and an exposed portion of the semiconductor substrate 10 (portion of the first main surface not covered by the second protective layer 70A) (typically, the shortest distance therebetween) is increased by the presence of the first protective layer 50A on the end portion 32 of the first electrode layer 30. Therefore, the creeping discharge can be suppressed, and the withstand voltage between the first electrode layer 30 and the semiconductor substrate 10 can be improved.

That is, the second protective layer 70A continuously covers a portion from the end portion 32 of the first electrode layer 30 to the first main surface 11 of the semiconductor substrate 10. More specifically, the second protective layer 70A continuously covers the end portion 32 of the first electrode layer 30, a second side surface 54b (inner peripheral end), a first upper surface 53a and a first side surface 54a of the first protective layer 50A, and the upper surface 24 and the first outer peripheral end 26a of the dielectric film 20 without interruption.

[Method for Manufacturing Semiconductor Device 1A]

A method for manufacturing the semiconductor device 1A is the same as the method for manufacturing the semiconductor device 1 of the first embodiment except that a pattern of the first protective layer in the first protective layer forming step and a pattern of the second protective layer in the second protective layer forming step are changed as desired.

Third Embodiment

[Configuration]

Figure 5:
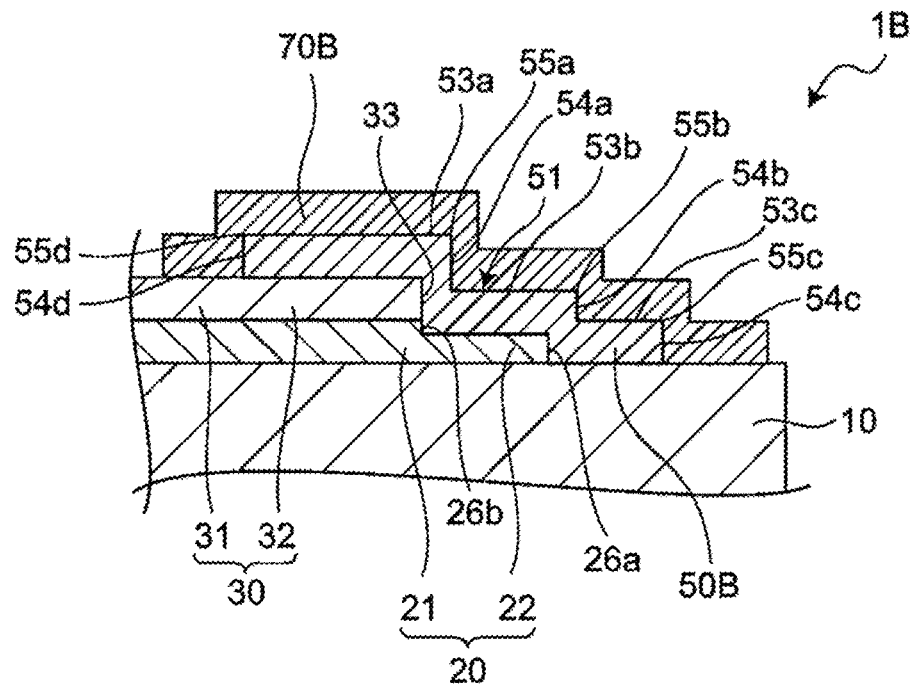
FIG. 5 is an enlarged partial sectional view of a semiconductor device according to a third embodiment.

FIG. 5 is a schematic enlarged sectional view of a semiconductor device 1B according to a third embodiment. The third embodiment is a modified example of the second embodiment, and is different from the second embodiment in terms of an arrangement place of the first protective layer. This different configuration will be described below. Note that, in the third embodiment, the same reference numerals as those in the first and second embodiments indicate the same configurations as those in the first embodiment, and thus the description thereof will be omitted.

As illustrated in FIG. 5, in the semiconductor device 1B according to the third embodiment, a first protective layer 50B continuously covers a portion from the end portion 32 of the first electrode layer 30 to the first outer peripheral end 26a of the protective layer covering portion 22 of the dielectric film 20. That is, the first protective layer 50B continuously covers the end portion 32 and the second outer peripheral end 33 of the first electrode layer 30, the fourth outer peripheral end 26b, the upper surface 24, and the first outer peripheral end 26a of the dielectric film 20, and a part of the first main surface 11 of the semiconductor substrate 10 without interruption. As described above, the first protective layer 50B further covers the first outer peripheral end 26a of the protective layer covering portion 22 of the dielectric film 20, and increases an area in which the first protective layer 50B covers the first electrode layer 30. Therefore, dielectric breakdown between the second outer peripheral end 33 of the first electrode layer 30 and the first main surface 11 of the semiconductor substrate 10 can be further suppressed, and a decrease in the dielectric breakdown strength of the dielectric film 20 can be further suppressed.

The first protective layer 50B has a step portion 51 in which an upper surface (first to third upper surfaces 53a to 53c) is lowered in a step shape. The step portion 51 of the first protective layer 50B is configured to have three pairs of first to third upper surfaces 53a to 53c and first to third side surfaces 54a to 54c, and first to third corner portions 55a to 55c, and have a pair of the first upper surface 53a and a fourth side surface, and a fourth corner portion 55d. In the aspect illustrated in the drawing, the step portion 51 has, on the surface of the first protective layer 50B, the first upper surface 53a and the first side surface 54a that form the first corner portion 55a, the second upper surface 53b and the second side surface 54b that form the second corner portion 55b, and the third upper surface 53c, the third side surface 54c that form the third corner portion 55c, a fourth side surface (inner peripheral end) 54d that forms the fourth corner portion 55d on an inner edge of the first upper surface 53a. In other words, the step portion 51 has the first step (corresponding to the first side surface 54a) between the first upper surface 53a and the second upper surface 53b, the second step (corresponding to the second side surface 54b) between the second upper surface 53b and the third upper surface 53c, and the third step (corresponding to the third side surface 54c) between the third upper surface 53c and the first main surface 11, and is formed to be sequentially lowered in a step shape on the surface of the first protective layer 50B.

For each step, the shape of the upper surface and the side surface that form the step, and the shape of the corner portion formed by the upper surface and the side surface are not limited to the form (sectional shape) illustrated in the drawing, and the above description of the step in the first embodiment may be applied in the same manner.

A second protective layer 70B continuously covers a portion from the fourth side surface 54d (inner peripheral end) of the first protective layer 50B to the third side surface 54c of the first protective layer 50B. That is, the second protective layer 70B continuously covers a part of the upper surface of the first electrode layer 30, the first to third upper surfaces 53a to 53c of the first protective layer 50B, the first to fourth side surfaces 54a to 54d of the first protective layer 50B, and a part of the first main surface 11 of the semiconductor substrate 10 without interruption.

[Method for Manufacturing Semiconductor Device 1B]

A method for manufacturing a semiconductor device 1B is the same as the method for manufacturing the semiconductor device 1 of the first embodiment except that a pattern of the first protective layer in the first protective layer forming step and a pattern of the second protective layer in the second protective layer forming step are changed as desired.

Fourth Embodiment

[Configuration]

Figure 6:
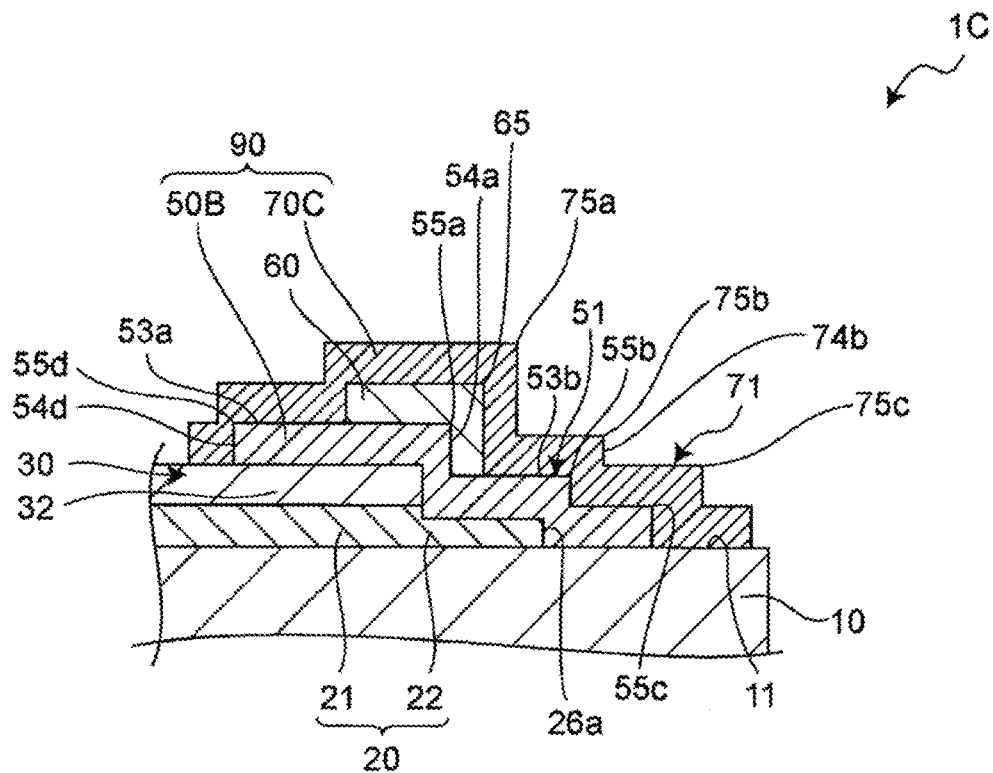
FIG. 6 is an enlarged partial sectional view of a semiconductor device according to a fourth embodiment.

FIG. 6 is a schematic enlarged sectional view of a semiconductor device 1C according to a fourth embodiment. The fourth embodiment is a modified example of the third embodiment, and is different from the third embodiment in that a first metal film is further provided. This different configuration will be described below. Note that, in the fourth embodiment, the same reference numerals as those in the first to third embodiments indicate the same configurations as those in the first embodiment, and thus the description thereof will be omitted.

As illustrated in FIG. 6, the semiconductor device 1C according to the fourth embodiment further includes a first metal film 60. The first metal film 60 is disposed between the first protective layer 50B and a second protective layer 70C. The first metal film 60 covers at least a part of the first protective layer 50B. Specifically, the first metal film 60 continuously covers the first upper surface 53a, the first corner portion 55a, and the first side surface 54a of the first protective layer 50B. That is, the first metal film 60 is formed in contact with an inner peripheral surface of the second protective layer 70C in the vicinity of the first step. Since the first metal film 60 is formed of metal and has low moisture permeability, it is difficult to cause moisture to pass through the first metal film 60, and the moisture resistance of the first metal film 60 is higher than that of the first protective layer 50B. Accordingly, in a case where cracks occur in the second protective layer 70C, particularly in the first corner portion 75a of the second protective layer 70C and the second protective layer 70C around a corner portion 65 of the first metal film 60, the moisture is prevented from entering the dielectric film 20 through the cracks. Therefore, dielectric breakdown between an end portion of the first electrode layer 30 and the first main surface 11 of the semiconductor substrate 10 can be further suppressed, and a decrease in the dielectric breakdown strength of the dielectric film 20 can be further suppressed. Furthermore, since the first metal film 60 is disposed between the first protective layer 50B and the second protective layer 70C, a creeping distance of the surface of the protective layer 90, more specifically, a distance of the surface of the second protective layer 70C between an exposed portion of the first electrode layer 30 (portion not covered by the second protective layer 70C) and an exposed portion of the semiconductor substrate 10 (portion of the first main surface 11 not covered by the second protective layer 70C) (typically, the shortest distance therebetween) is increased, and creeping discharge on the surface of the protective layer 90 is suppressed.

The first protective layer 50B has the step portion 51 with one or more corner portions, and the first metal film 60 covers at least one corner portion of the first protective layer 50B. Specifically, the first metal film 60 continuously covers the first upper surface 53a, the first corner portion 55a, and the first side surface 54a of the first protective layer 50B. The first metal film 60 preferably covers any of a plurality of the corner portions (first to fourth corner portions 55a, 55b, 55c, and 55d) of the first protective layer 50B, and more preferably covers a plurality of the corner portions (two or more of the first to fourth corner portions 55a, 55b, 55c, and 55d). This is because, in a case where the second protective layer 70C has the step portion 71, cracks are likely to occur around the corner portions 75a, 75b, and 75c on the outer periphery of the second protective layer 70C and around the corner portion on the inner periphery of the second protective layer 70C (more specifically, a portion in contact with the corner portion 65 of the first metal film 60 and a portion in contact with the corner portions 55b and 55c of the first protective layer). In particular, the first metal film 60 is preferably disposed so as to straddle the electrode layer disposing portion 21 and the protective layer covering portion 22 of the dielectric film 20. More specifically, by forming the protective layer covering portion 22 of the dielectric film 20 as a thin film region, the first step formed by the first upper surface 53a and the second upper surface 53b which is one step down from the first upper surface 53a becomes large, and thus the first metal film 60 preferably covers the first corner portion 55a of a plurality of the corner portions (first to fourth corner portions 55a, 55b, 55c, and 55d) of the first protective layer 50B. Since the first metal film 60 is formed of metal, it is excellent in the moisture resistance. Therefore, in a case where cracks occur around the corner portions 75a, 75b, and 75c on the outer periphery of the second protective layer 70C and in the corner portions on the inner periphery of the second protective layer 70C, the moisture is prevented from entering the first protective layer 50B by the first metal film 60.

The first protective layer 50B is covered by the second protective layer 70C and the first metal film 60. Therefore, the first protective layer 50B is protected against moisture by the second protective layer 70C and the first metal film 60 having relatively high moisture resistance over the entire outer surface of the first protective layer 50B. Accordingly, external moisture is prevented from entering the dielectric film 20 through the first protective layer 50B, and a decrease in the dielectric breakdown strength of the dielectric film 20 is further suppressed.

A thickness of the first metal film 60 is, for example, 0.1 μm to 3 μm. When the thickness of the first metal film 60 is 0.1 μm to 3 μm, moisture can be prevented from entering the dielectric film 20, and the moisture resistance of the semiconductor device 1C is improved.

A material of the first metal film 60 is, for example, metal (more specifically, Al or the like) from the viewpoint of improving the moisture resistance of the first metal film 60. The material of the first metal film 60 is preferably Al among these materials. That is, the first protective layer 50B is preferably formed of Al.

[Method for Manufacturing Semiconductor Device 1C]

A method for manufacturing a semiconductor device 1C is the same as the method for manufacturing the semiconductor device 1B of the third embodiment except that a first metal film forming step is further included after the first protective layer forming step and before the second protective layer forming step. In the first metal film forming step, a metal film may be formed by the sputtering method or the vacuum vapor deposition method on an exposed surface of the semiconductor substrate on which the dielectric film, the first electrode layer, and the first protective layer are formed, and then the metal film may be patterned on the first metal film 60 by the photolithography method and the dry etching method.

Fifth Embodiment

[Configuration]

Figure 7:
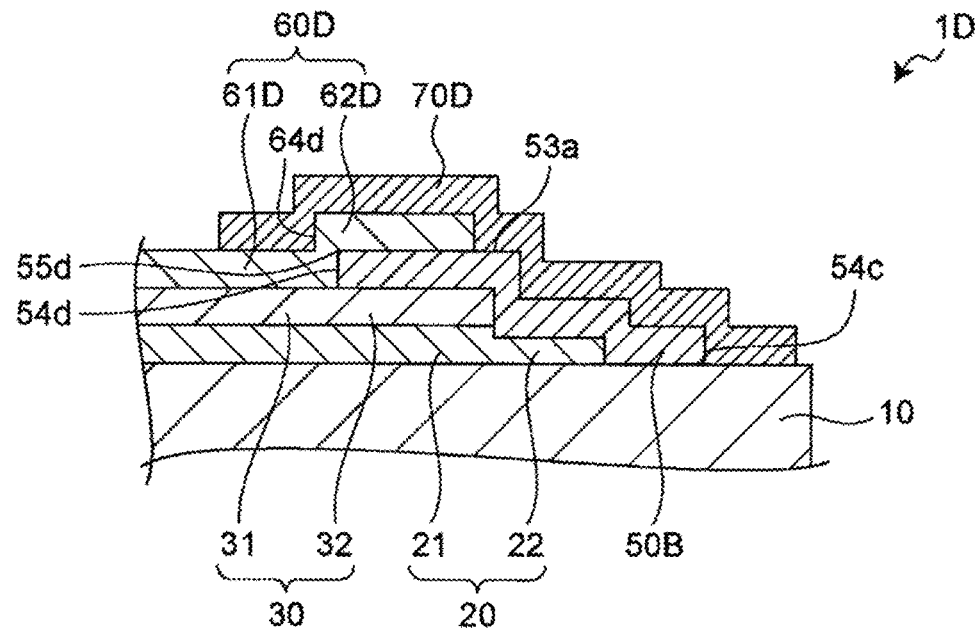
FIG. 7 is an enlarged partial sectional view of a semiconductor device according to a fifth embodiment.

FIG. 7 is a schematic enlarged sectional view of a semiconductor device 1D according to a fifth embodiment. The fifth embodiment is a modified example of the fourth embodiment, and is different from the fourth embodiment in terms of an arrangement place of the first metal film. This different configuration will be described below. Note that, in the fifth embodiment, the same reference numerals as those in the first to fourth embodiments indicate the same configurations as those in the first to fourth embodiments, and thus the description thereof will be omitted.

As illustrated in FIG. 7, in the semiconductor device 1D according to the fifth embodiment, the first electrode layer 30 has an end portion 32 covered by the first protective layer 50B, and the central portion 31. A first metal film 60D is disposed on the first upper surface 53a of the first protective layer 50B. Moreover, the first metal film 60D is disposed so as to be exposed on the central portion 31 of the first electrode layer 30 and is electrically connected to the first electrode layer 30. Therefore, the first metal film 60D functions as an external connection electrode in addition to the function of suppressing dielectric breakdown of the dielectric film 20.

In the sectional view, the first metal film 60D continuously covers the first protective layer 50B and the central portion 31 of the first electrode layer 30 from the first upper surface 53a of one first protective layer 50B to the first upper surface 53a of the other first protective layer 50B. The first metal film 60D has a central portion 61D covering the central portion 31 of the first electrode layer 30 and an end portion 62D covering the first protective layer 50B. The first metal film 60D covers the corner portion 55d of the first protective layer 50B.

A second protective layer 70D continuously covers the first protective layer 50B and the end portion 62D of the first metal film 60D from a side surface 64d of the first metal film 60D to the third side surface 54c of the first protective layer 50B. That is, the second protective layer 70D covers a part of the central portion 61D of the first metal film 60D and the end portion 62D of the first metal film 60D, and the first protective layer 50B. The first metal film 60D is disposed on an inner side from a boundary between the electrode layer disposing portion 21 of the dielectric film 20 and the protective layer covering portion 22 of the dielectric film 20 (in other words, separated toward the central portion 31 side of the first electrode layer 30). The first metal film 60D covers the corner portion 55d of the first protective layer 50B and is disposed on the inner side from the boundary between the electrode layer disposing portion 21 and the protective layer covering portion 22. Therefore, moisture can be effectively prevented from entering the first protective layer 50B. Furthermore, according to this, a creeping distance of the surface of the second protective layer 70D, more specifically, a distance of the surface of the second protective layer 70D between an exposed portion of the first metal film 60D (portion of the central portion 61D not covered by the second protective layer 70D) and an exposed portion of the semiconductor substrate 10 (portion of the first main surface not covered by the second protective layer 70D) (typically, the shortest distance therebetween) is increased, and creeping discharge on the surface of the protective layer is effectively prevented.

[Method for Manufacturing Semiconductor Device 1D]

A method for manufacturing the semiconductor device 1D is the same as the method for manufacturing the semiconductor device 1C of the fourth embodiment except that a pattern of the first metal film in the first metal film forming step and a pattern of the second protective layer in the second protective layer forming step are changed.

Sixth Embodiment

[Configuration]

Figure 8:
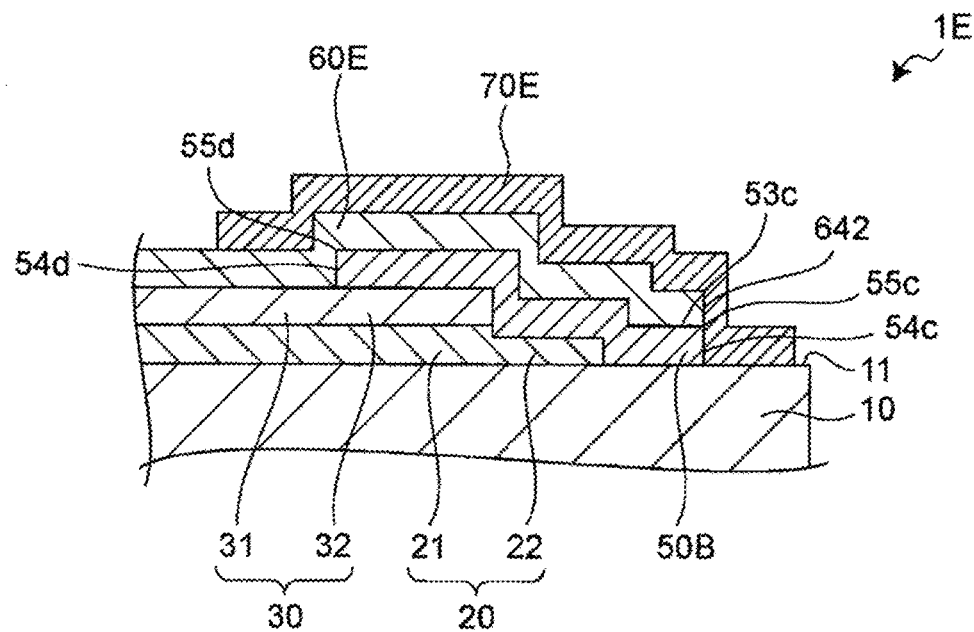
FIG. 8 is an enlarged partial sectional view of a semiconductor device according to a sixth embodiment.

FIG. 8 is a schematic enlarged sectional view of a semiconductor device 1E according to a sixth embodiment. The sixth embodiment is a modified example of the fifth embodiment, and is different from the fifth embodiment in terms of an arrangement place of a first metal film 60E. This different configuration will be described below. Note that, in the sixth embodiment, the same reference numerals as those in the first to fifth embodiments indicate the same configurations as those in the first to fifth embodiments, respectively, and thus the description thereof will be omitted.

As illustrated in FIG. 8, in the semiconductor device 1E according to the sixth embodiment, a third outer peripheral end (third side surface 54c) of the first protective layer 50B is covered by a second protective layer 70E. The first metal film 60E continuously covers the central portion 31 of the first electrode layer 30 and the first protective layer 50B other than the third outer peripheral end. That is, in the sectional view, the first metal film 60E continuously covers a portion from the third upper surface 53c of one first protective layer 50B to the third upper surface 53c of the other first protective layer 50B. A thickness of the first protective layer 50B is equal to or greater than the thickness of the electrode layer disposing portion 21 of the dielectric film 20.

Therefore, the first protective layer 50B functions as a stress relaxation layer, and suppresses the occurrence of peeling and cracks of the second protective layer 70E due to stress. Accordingly, moisture can be further prevented from entering the dielectric film 20 through the cracks, and a decrease in the dielectric breakdown strength of the dielectric film 20 can be further suppressed.

Furthermore, the first metal film 60E is disposed between the first protective layer 50B and the second protective layer 70E, and continuously covers the first protective layer 50B other than the third outer peripheral end of the first protective layer 50B. The first protective layer 50B is doubly covered by the first metal film 60E and the second protective layer 70E that have relatively high moisture resistance. Therefore, moisture is prevented from entering the first protective layer 50B and further entering the protective layer covering portion 22 of the dielectric film 20, and a decrease in the dielectric breakdown strength of the dielectric film 20 can be further suppressed.

Furthermore, the first metal film 60E continuously covers the first protective layer 50B except the third outer peripheral end of the first protective layer 50B. Therefore, in a case where cracks occur in the second protective layer 70B, moisture is prevented from entering the protective layer covering portion 22 of the dielectric film 20.

A fifth outer peripheral end (corresponding to a side surface 642) of the first metal film 60E is disposed away from the first main surface 11. Therefore, the fifth outer peripheral end of the first metal film 60E is not electrically connected to the first main surface 11. That is, the first electrode layer 30 and the semiconductor substrate 10 are electrically insulated.

The second protective layer 70E continuously covers the first protective layer 50B and the first metal film 60E from the side surface 642 of the first metal film 60E to the third side surface 54c of the first protective layer 50B.

[Method for Manufacturing Semiconductor Device 1E]

A method for manufacturing the semiconductor device 1E is the same as the method for manufacturing the semiconductor device 1D of the fifth embodiment except that a pattern of the first metal film in the first metal film forming step and a pattern of the second protective layer in the second protective layer forming step are changed.

Seventh Embodiment

[Configuration]

Figure 9:
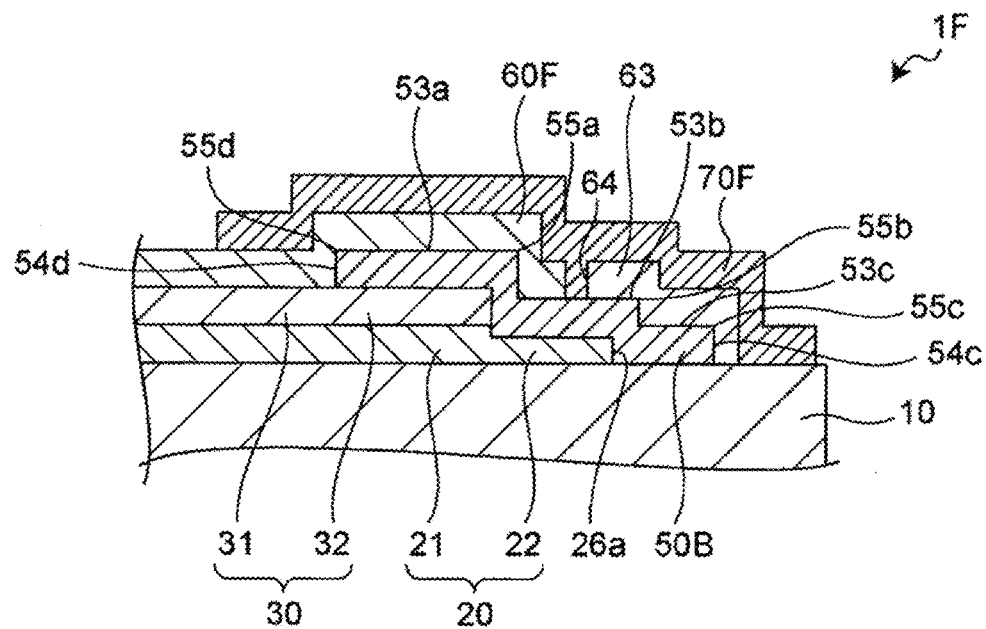
FIG. 9 is an enlarged partial sectional view of a semiconductor device according to a seventh embodiment.

FIG. 9 is a schematic enlarged sectional view of a semiconductor device 1F according to a seventh embodiment. The seventh embodiment is a modified example of the fifth embodiment, and is different from the fifth embodiment in terms of an arrangement place of a first metal film 60F and in that a second metal film 63 is further provided. This different configuration will be described below. Note that, in the seventh embodiment, the same reference numerals as those in the first to fifth embodiments indicate the same configurations as those in the first to fifth embodiments, respectively, and thus the description thereof will be omitted.

As illustrated in FIG. 9, the semiconductor device 1F according to the seventh embodiment further includes the second metal film 63. The second metal film 63 covers the third outer peripheral end (corresponding to the third side surface 54c) of the first protective layer 50B, and is separated from the first metal film 60F with a cavity 64. The cavity 64 is disposed such that the second upper surface 53b of the first protective layer 50B is in contact with a second protective layer 70F. That is, the first metal film 60F and the second metal film 63 continuously cover the first protective layer 50B except the cavity 64 so as to cover the first to fourth corner portions 55a, 55b, 55c, and 55d of the first protective layer 50B. Moreover, the first metal film 60F, the second metal film 63, and the first protective layer 50B are covered by the second protective layer 70F. As described above, the first protective layer 50B is doubly covered by the first metal film 60F, the second metal film 63, and the second protective layer 70F that have relatively high moisture resistance. Therefore, in a case where moisture enters the first protective layer 50B through the second protective layer 70F, the moisture is prevented from entering the protective layer covering portion 22 of the dielectric film 20 and the dielectric breakdown of the dielectric film 20 can be further suppressed.

Furthermore, in the present embodiment, the third outer peripheral end of the first protective layer 50B is covered unlike the sixth embodiment in which the first protective layer 50B is continuously covered by the first metal film 60E except the third outer peripheral end of the first protective layer 50B. Therefore, for example, peeling in the third outer peripheral end of the first protective layer 50B can be effectively prevented.

The second metal film 63 is separated from the first metal film 60F by the cavity 64. Therefore, the second metal film 63 is not electrically connected to the first metal film 60F. That is, the first electrode layer 30 and the semiconductor substrate 10 are electrically insulated. Note that, the cavity 64 is provided on the second upper surface 53b of the first protective layer 50B, but is not limited thereto. The cavity 64 may be provided on the first upper surface 53a and/or the third upper surface 53c of the first protective layer 50B. Preferably, the cavity 64 is provided on the first to third upper surfaces 53a, 53b, and 53c, and the first metal film 60F and the second metal film 63 cover all of the first to fourth corner portions 55a, 55b, 55c, and 55d of the first protective layer 50B.

The cavity 64 is disposed on an inner side from the first outer peripheral end 26a of the protective layer covering portion 22 of the dielectric film 20 (on the electrode layer disposing portion 21 side of the dielectric film 20) in a case where the semiconductor device 1F is viewed from the Z direction.

[Method for Manufacturing Semiconductor Device 1F]

A method for manufacturing the semiconductor device 1F is the same as the method for manufacturing the semiconductor device 1D of the fifth embodiment except that a pattern of the first metal film in the first metal film forming step and a pattern of the second protective layer in the second protective layer forming step are changed. In the first metal film forming step, the second metal film 63 can be formed together with the first metal film 60F.

Eighth Embodiment

[Configuration]

Figure 10:
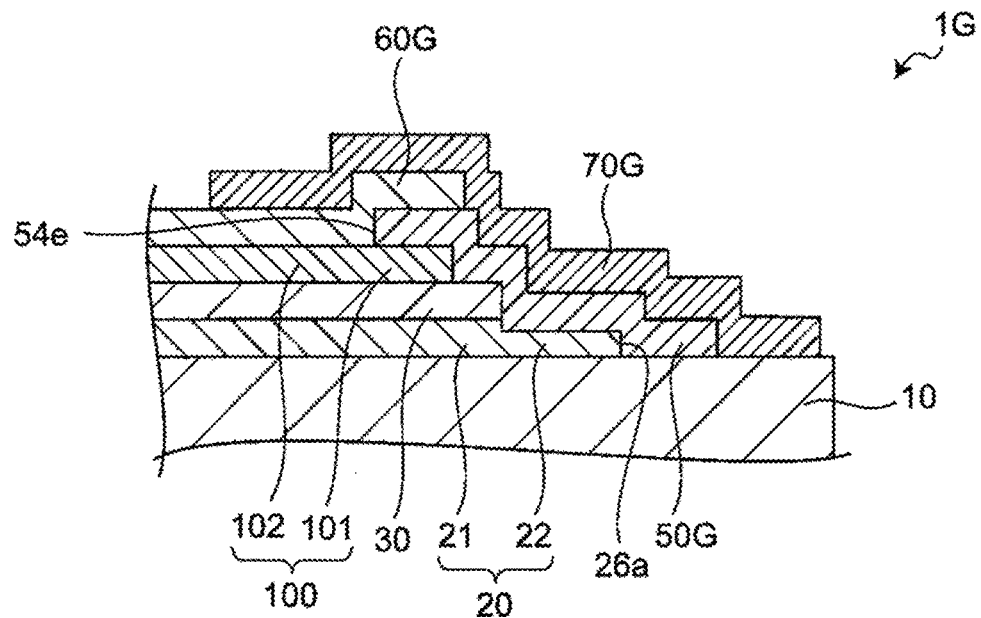
FIG. 10 is an enlarged partial sectional view of a semiconductor device according to an eighth embodiment.

FIG. 10 is a schematic enlarged sectional view of a semiconductor device 1G according to an eighth embodiment. The eighth embodiment is a modified example of the fifth embodiment, and is different from the fifth embodiment in that a diffusion prevention film 100 is further provided. This different configuration will be described below. Note that, in the eighth embodiment, the same reference numerals as those in the first to fifth embodiments indicate the same configurations as those in the first to fifth embodiments, respectively, and thus the description thereof will be omitted.

As illustrated in FIG. 10, in the semiconductor device 1G according to the eighth embodiment, the diffusion prevention film 100 is disposed between the first electrode layer 30 and the first metal film 60G. Since the first electrode layer 30 and the first metal film 60G are not in contact with each other, it is possible to prevent a material forming the first electrode layer 30 from diffusing to the first metal film 60G. Accordingly, the semiconductor device 1G can operate stably. For example, in a case where the first electrode layer 30 is formed of polysilicon, the first metal film 60G is formed of Al, and the diffusion prevention film 100 is formed of an Al—Si based alloy, the diffusion prevention film 100 prevents polysilicon, which is a material forming the first electrode layer 30, from diffusing to the first metal film 60G.

The diffusion prevention film 100 is disposed on a part of the first electrode layer 30. In a range from the end portion 101 of the diffusion prevention film 100 to the first outer peripheral end 26a of the protective layer covering portion 22 of the dielectric film 20, a first protective layer 50G continuously covers an end portion 101 of the diffusion prevention film 100, a part of the first electrode layer 30, and the protective layer covering portion 22. The first metal film 60G covers an inner peripheral end (corresponding to a fifth side surface 54e) of the first protective layer 50G and a central portion 102 of the diffusion prevention film 100.

[Method for Manufacturing Semiconductor Device 1G]

A method for manufacturing the semiconductor device 1G is the same as the method for manufacturing the semiconductor device 1D of the fifth embodiment except that a diffusion prevention film forming step is further included after the first electrode layer forming step and before the first protective layer forming step.

(Diffusion Prevention Film Forming Step)

In the diffusion prevention film forming step, the diffusion prevention film 100 is formed at the central portion 31 of the first electrode layer 30. In the diffusion prevention film forming step, for example, the diffusion prevention film 100 is formed on the semiconductor substrate 10 on which the first electrode layer 30 is disposed, and the diffusion prevention film 100 is patterned. Specifically, for example, by using the sputtering method or a vapor deposition method, the diffusion prevention film 100 formed of an Al—Si based alloy is formed on semiconductor substrate 10 on which the first electrode layer 30 is disposed so as to have a thickness of 0.1 µm to 3 µm. Next, the diffusion prevention film 100 is patterned by the photolithography method and the dry etching method.

(First Protective Layer Forming Step)

In the first protective layer forming step, the first protective layer 50G that continuously covers the end portion 101 of the diffusion prevention film 100, a part of the first electrode layer 30, and the protective layer covering portion 22 is formed.

(First Metal Film Forming Step)

In the first metal film forming step, the first metal film 60G, which covers the inner peripheral end (corresponding to the fifth side surface 54e) of the first protective layer 50G and the central portion 102 of the diffusion prevention film 100, is formed.

Ninth Embodiment

[Configuration]

Figure 11:
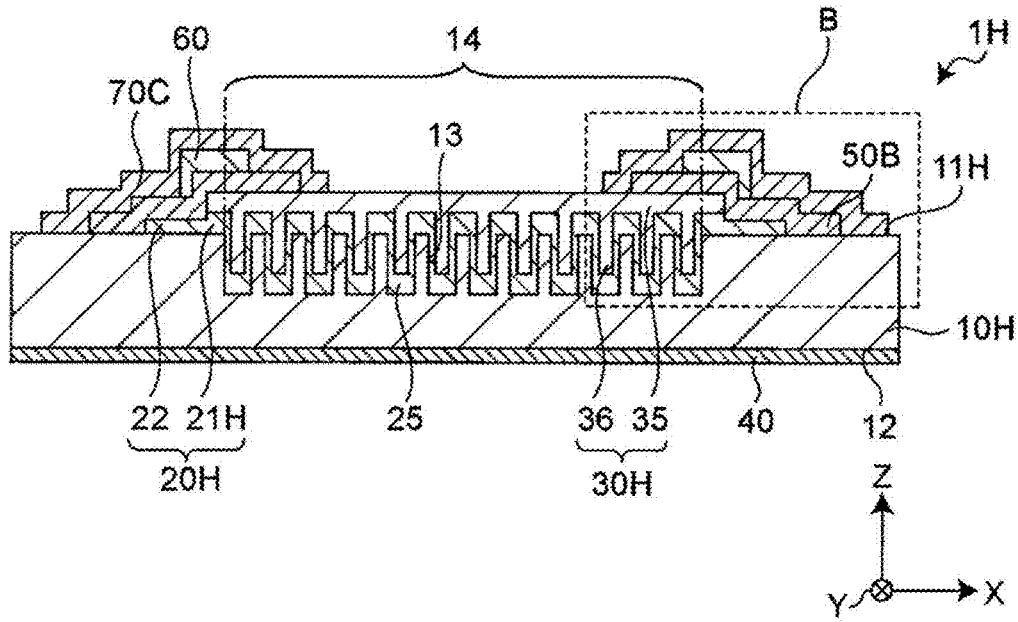
FIG. 11 is a sectional view of a semiconductor device according to a ninth embodiment.

FIG. 11 is a schematic sectional view of a semiconductor device 1H according to a ninth embodiment. The ninth embodiment is a modified example of the fourth embodiment, and is different from the fourth embodiment in that a trench structure (groove structure) is provided. This different configuration will be described below. Note that, in the ninth embodiment, the same reference numerals as those in the first to fourth embodiments indicate the same configurations as those in the fourth embodiment, and thus the description thereof will be omitted.

As illustrated in FIG. 11, in the semiconductor device 1H according to the ninth embodiment, a semiconductor substrate 10H has a trench (groove) 13 on a first main surface 11H on which an electrode layer disposing portion 21H of a dielectric film 20H is disposed. The electrode layer disposing portion 21H of the dielectric film 20H is disposed on the first main surface 11H including an inner surface of the trench 13 so as to cover the inner surface of the trench 13 to form a recess 25. A first electrode layer 30H has an entering portion 36 that enters the recess 25.

Since the semiconductor device 1H has a trench structure 14, an area of an interface formed by the dielectric film 20H and the first electrode layer 30H increases as compared with a semiconductor device not having the trench structure 14. Accordingly, the semiconductor device 1H can increase the electric capacitance.

The electrode layer disposing portion 21H of the dielectric film 20H has the recess 25 covering the inner surface of the trench 13. The first electrode layer 30H has a planar portion 35 and the entering portion 36. The entering portion 36 extends in the opposite Z direction from the planar portion 35 and fills the recess 25. The first electrode layer 30H has a comb shape.

A shape of the entering portion 36 (sectional shape on a ZX plane) is a rectangular shape extending in the opposite Z direction as illustrated in FIG. 11. Furthermore, the shape of the entering portion 36 (sectional shape on an XY plane) is, for example, a polygon (more specifically, a quadrangle, a pentagon, a hexagon, and the like) and a circle.

The shape of the entering portion 36 (sectional shape on the ZX plane) is a shape of which a lower end portion has a bottom. A shape of the bottom is, for example, a polygon (more specifically, a quadrangle, a pentagon, and a hexagon), a circle, or the like. Note that, the shape of the entering portion 36 (sectional shape on the ZX plane) is not limited to the shape of which a lower end portion has a bottom, and for example, the shape may be semicircular.

The entering portion 36 can have a tapered (inclined) side surface (inner surface). That is, the entering portion 36 may have a shape in which a width (length in the X direction) increases or decreases from the lower end portion toward the first main surface 11H. The recess 25 can also be tapered on the outer surface and the inner surface thereof.

The recess 25 and the entering portion 36 are disposed along the X direction. For example, the recess 25 and the entering portion 36 may be disposed in a matrix shape in a case where a section (section taken along the XY plane) including the recess 25 and the entering portion 36 is viewed from a direction perpendicular to the first main surface 11H.

Density of the recess 25 and the entering portion 36 (the number of trenches 13 per unit area of the first main surface 11H) is, for example, about 15,000/mm$^2$.

Figure 12:
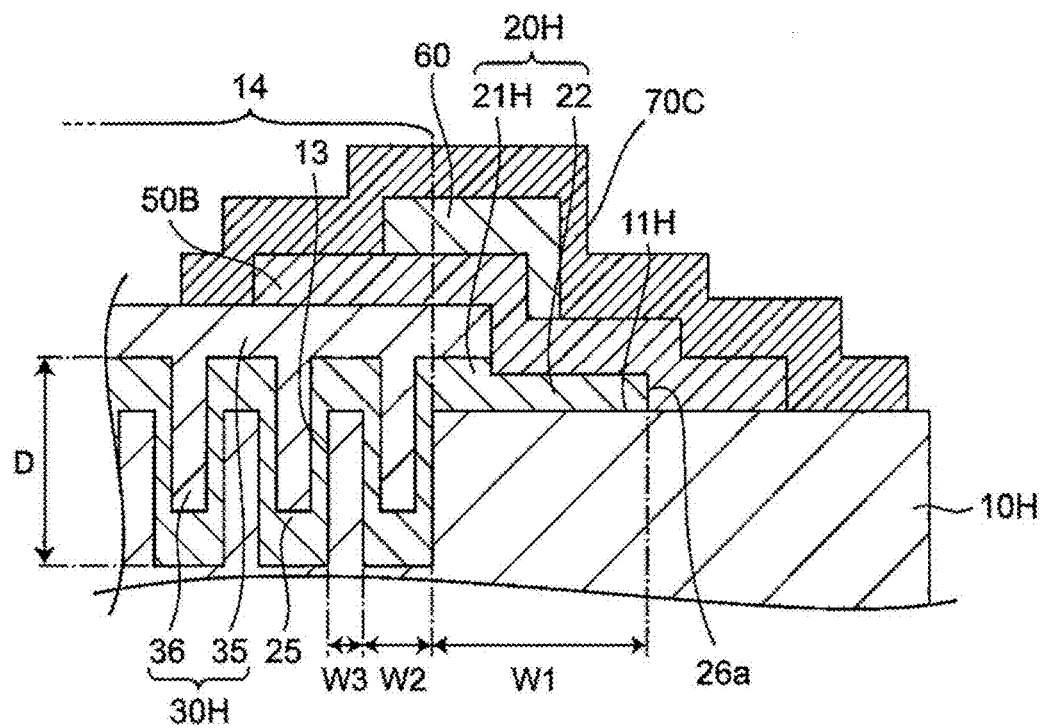
FIG. 12 is an enlarged view of a portion B in FIG. 11.

FIG. 12 is an enlarged view of a portion B in FIG. 11. As illustrated in FIG. 12, a length D of the recess 25 is, for example, 10 μm to 50 μm. A width W2 of the recess 25 in the X direction is, for example, about 5 μm. An aspect ratio of the outer shape of the recess 25 (ratio of the length D in the Z direction to the width W2 in the X direction) is, for example, 2 to 10. A distance W3 between the recesses 25 in the X direction is, for example, about 3 μm. A distance W1 from the first outer peripheral end 26 of the dielectric film 20H to an end portion of the trench structure 14 is, for example, 50 μm to 200 μm.

The density, shape, length D, and the like of the recess 25 can be appropriately adjusted in accordance with a desired electric capacitance.

Furthermore, in the ninth embodiment, a thickness of the dielectric film 20H refers to the thickness of the dielectric film 20H in the Z direction, which covers the first main surface 11H on which the trench 13 is not formed.

[Method for Manufacturing Semiconductor Device 1H]

A method for manufacturing the semiconductor device 1H further includes a trench forming step before the dielectric film forming step in the method for manufacturing the semiconductor device 1. That is, the method for manufacturing the semiconductor device 1H includes: a trench forming step of forming the trench 13 on the first main surface 11H of the semiconductor substrate 10H; a dielectric film forming step of forming the dielectric film 20H (more specifically, including the electrode layer disposing portion 21H and a portion to be the protective layer covering portion 22 later, which are precursors of the dielectric film 20H described above with reference to FIGS. 11 to 12) on the first main surface 11H so as to cover the inner surface of the trench 13 to form the recess 25; a first electrode layer forming step of forming the first electrode layer 30H on the dielectric film 20H and removing a part of the dielectric film 20H to form the protective layer covering portion 22 (thin film region) (thereby, the dielectric film 20H including the electrode layer disposing portion 21H and the protective layer covering portion 22 is formed) so as to form the entering portion 36 entering the recess 25; a first protective layer forming step of forming the first protective layer 50B continuously covering a portion from the end portion 32 of the first electrode layer 30H to the first main surface 11H of the semiconductor substrate 10H; a first metal film forming step of forming the first metal film 60 covering a part of the first protective layer 50B; a second protective layer forming step of forming the second protective layer 70C continuously covering at least a part of the first protective layer 50B and the first metal film 60; and a second electrode layer forming step of forming the second electrode layer 40 on the second main surface 12 of the semiconductor substrate 10H.

The method for manufacturing the semiconductor device 1H can further include a dicing step of segmenting a structure (mother integrated body) having a plurality of semiconductor device structures obtained above with a dicing machine.

Specifically, with reference to FIGS. 13A to 13G, an example of the method for manufacturing the semiconductor device 1H will be described. FIGS. 13A to 13G are views illustrating the method for manufacturing the semiconductor device 1H. The method for manufacturing the semiconductor device 1H includes the trench forming step, the dielectric film forming step, the first electrode layer forming step, the first protective layer forming step, the first metal film forming step, the second protective layer forming step, the second electrode layer forming step, and the dicing step.

Note that, a mother integrated body in which the semiconductor devices 1H are integrated is manufactured with the steps from the trench forming step to the second electrode layer forming step, but the manufacturing method will be described by focusing on one semiconductor device 1H for convenience of description.

(Trench Forming Step)

Figure 13A:
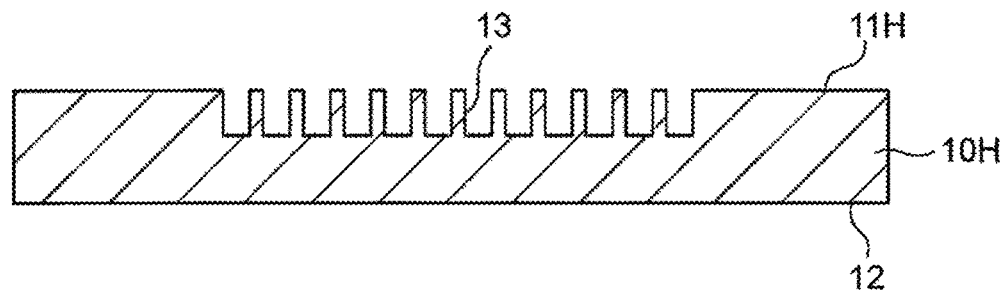
FIG. 13A is an explanatory view illustrating a method for manufacturing a semiconductor device.

In the trench forming step, as illustrated in FIG. 13A, the trench 13 is formed on the first main surface 11H of semiconductor substrate 10H. In the trench forming step, first, a silicon substrate is prepared as the semiconductor substrate 10H. Next, for example, deep etching (deep reactive ion etching (RIE)) is performed on the first main surface 11H of the semiconductor substrate 10H by using a Bosch process such that a distance W2 between the adjacent trenches 13 is 3 µm and a depth of the trench 13 is 5 µm. Accordingly, a plurality of the trenches 13 are formed on the first main surface 11H.

A planarization step may be included after the trench forming step. In the planarization step, the first main surface 11H of the semiconductor substrate 10H on which the trenches 13 are formed is planarized by using, for example, chemical mechanical polishing (CMP). Accordingly, in order to provide the semiconductor substrate 10H having a uniform thickness by removing a component of the semiconductor substrate 10H unnecessary for patterning of the trench, a desired layer configuration can be formed.

(Dielectric Film Forming Step)

Figure 13B:
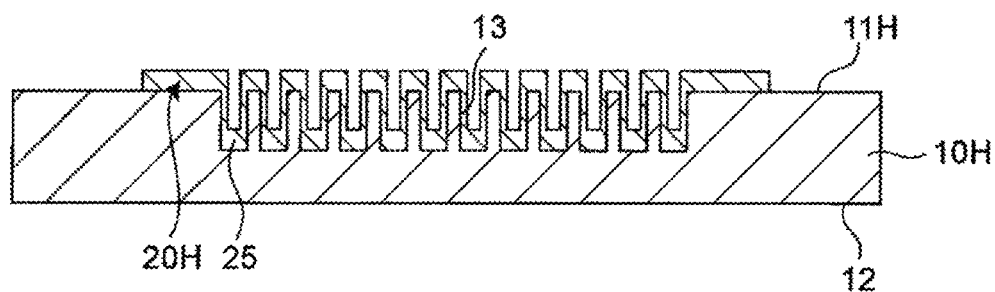
FIG. 13B is an explanatory view illustrating a method for manufacturing a semiconductor device.

In the dielectric film forming step, as illustrated in FIG. 13B, the dielectric film 20H is formed on the first main surface 11H so as to cover the inner surface of the trench 13 to form the recess 25. In the dielectric film forming step, for example, the dielectric film 20H is formed on the first main surface 11H of the semiconductor substrate 10H, and the dielectric film 20H is patterned. For example, the dielectric film 20H formed of Sift is formed to have a thickness of 0.1 µm to 3 µm on the first main surface 11H of the semiconductor substrate 10H by using the CVD method. Accordingly, the dielectric film 20H, in which the recess 25 is formed by covering the inner surface of the trench 13, is formed.

Next, the dielectric film 20H formed on the first main surface 11H of the semiconductor substrate 10H is patterned by the same method as the photolithography method and the dry etching method described in the dielectric film forming step of the method for manufacturing the semiconductor device 1 of the first embodiment. Accordingly, the dielectric film 20H (more specifically, including the electrode layer disposing portion 21H and a portion to be the protective layer covering portion 22 later, which are precursors of the dielectric film 20H described above with reference to FIGS. 11 to 12) having a predetermined pattern is formed on the first main surface 11H of the semiconductor substrate 10H.

(First Electrode Layer Forming Step)

Figure 13C:
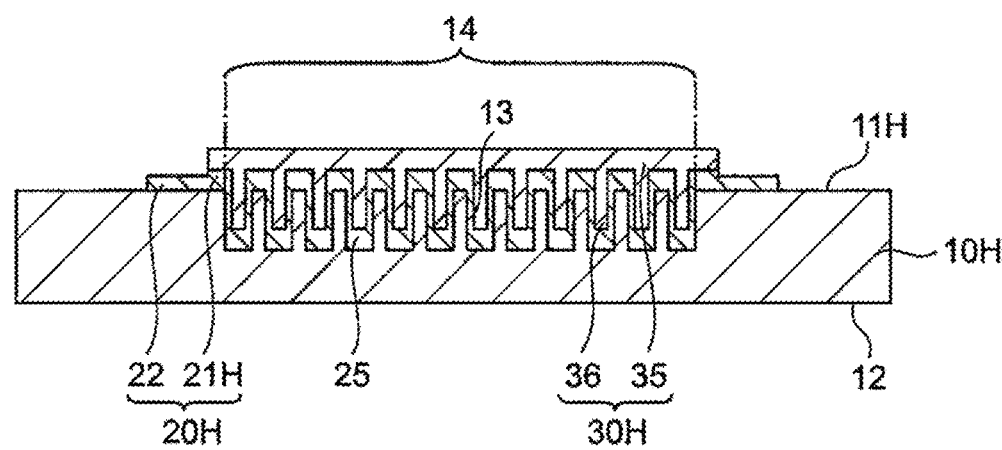
FIG. 13C is an explanatory view illustrating a method for manufacturing a semiconductor device.
Figure 13D:
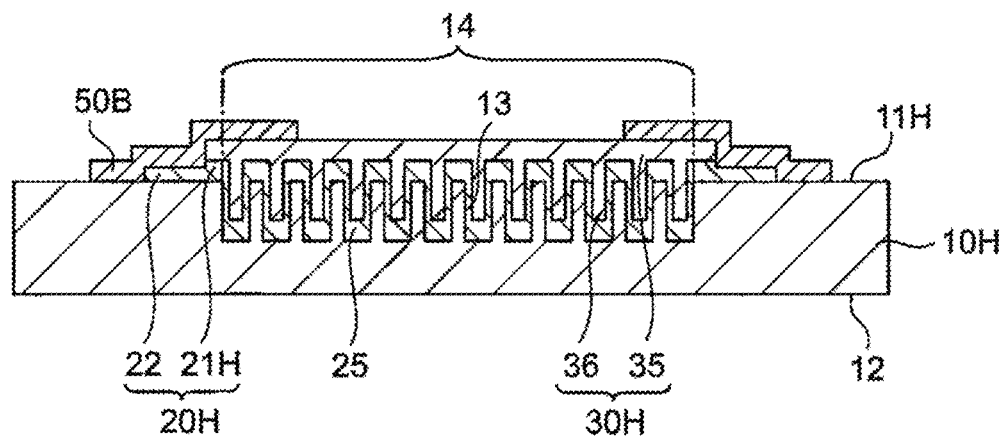
FIG. 13D is an explanatory view illustrating a method for manufacturing a semiconductor device.
Figure 13E:
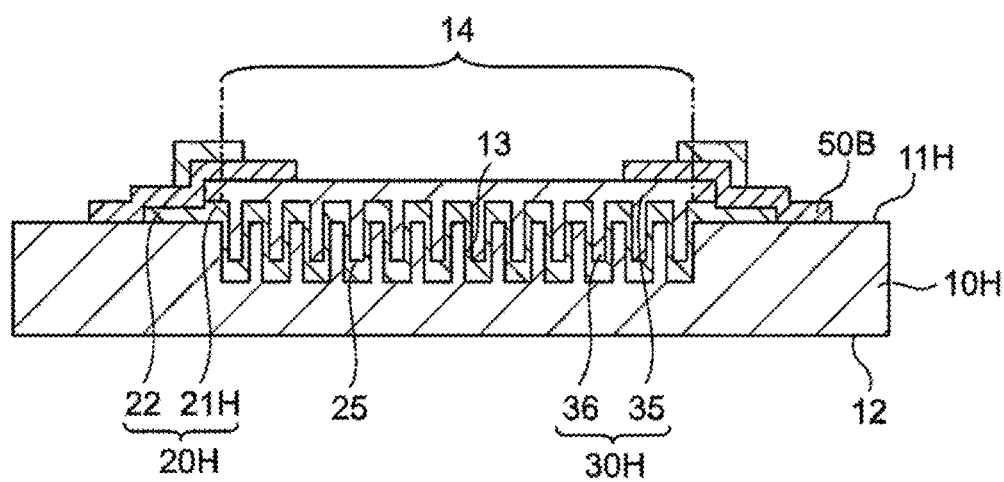
FIG. 13E is an explanatory view illustrating a method for manufacturing a semiconductor device.
Figure 13F:
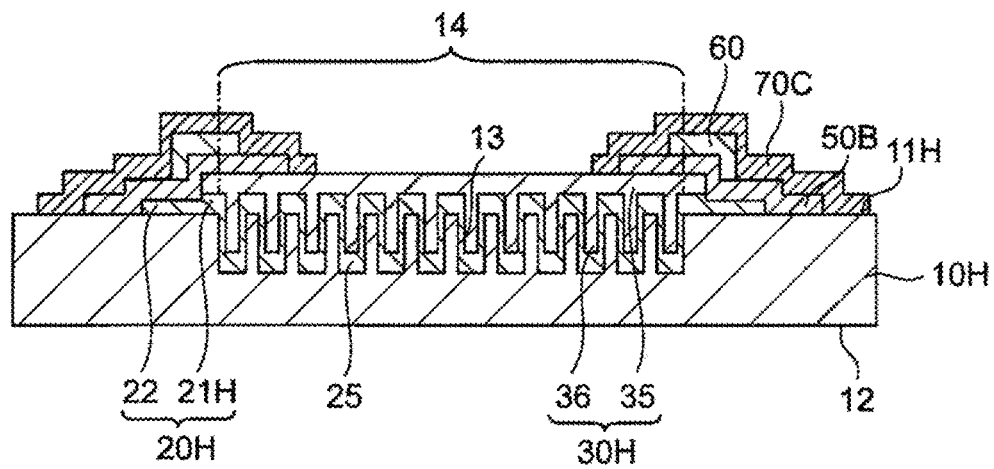
FIG. 13F is an explanatory view illustrating a method for manufacturing a semiconductor device.
Figure 13G:
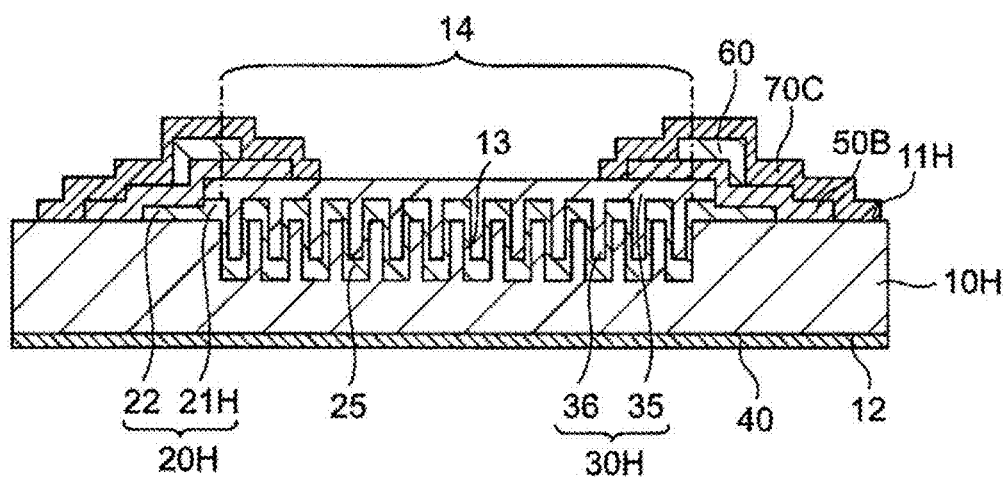
FIG. 13G is an explanatory view illustrating a method for manufacturing a semiconductor device.

In the first electrode layer forming step, as illustrated in FIG. 13C, the first electrode layer 30H is formed on the dielectric film 20H, and a part of the dielectric film 20H is removed to form the protective layer covering portion 22 (thin film region) so as to form the entering portion 36 entering the recess 25. In the first electrode layer forming step, for example, the first electrode layer 30H is formed on the first main surface 11H of the semiconductor substrate 10H on which the dielectric film 20H is disposed, and the first electrode layer 30H is patterned. Specifically, the first electrode layer 30H formed of Al, for example, is formed so as to have a thickness of 0.1 µm to 3 µm on the first main surface 11H of semiconductor substrate 10H on which the dielectric film 20H is disposed by using the sputtering method or the vacuum vapor deposition method. Accordingly, the first electrode layer 30H having the planar portion 35 and the entering portion 36 extending in the opposite Z direction from the planar portion 35 is formed. That is, the trench structure is formed.

Next, the first electrode layer 30H is patterned by the photolithography method and the dry etching method. In the patterning of the first electrode layer 30H, a part of the dielectric film 20H is also removed by the over-etching. Accordingly, the first electrode layer 30H having a predetermined pattern is formed, and the protective layer covering portion 22 (thin film region) of the dielectric film 20H is formed.

(First Protective Layer Forming Step to Dicing Step)

As illustrated in FIGS. 13D to 13G, the semiconductor device 1H is manufactured in the first protective layer forming step to the dicing step similar to the first protective layer forming step to the dicing step of the fourth embodiment, respectively.

Note that, the manufacturing conditions in the first to ninth embodiments are not limited as long as the protective layer covering portion of the dielectric film is formed such that the step at the first outer peripheral end of the protective layer covering portion of the dielectric film in the semiconductor device is smaller than the thickness of the electrode layer disposing portion of the dielectric film.

The present disclosure is not limited to the first to ninth embodiments, and can be implemented in various aspects as long as the gist of the present disclosure is not changed. Furthermore, the configurations described in the first to ninth embodiments are examples and are not particularly limited, and various modifications can be made without substantially departing from the effects of the present disclosure. For example, the matters described in the first to ninth embodiments can be appropriately combined.

The semiconductor device of the present invention has a capacitor structure by adding the second electrode layer, in other words, has a function as a capacitor. The semiconductor device of the present invention can be widely used for various applications, and for example, can be mounted on various electronic circuit boards as an electronic component including a capacitor by using the first electrode layer and the second electrode layer.

DESCRIPTION OF REFERENCE SYMBOLS 1, 1A, 1B, 1C, 1E, 1F, 1G, 1H: Semiconductor device
10, 10H: Semiconductor substrate
11, 11H: First main surface
12: Second main surface
13: Trench
20, 20H: Dielectric film
21, 21H: Electrode layer disposing portion of dielectric film
22: Protective layer covering portion of dielectric film
25: Recess of dielectric film
26a: First outer peripheral end of dielectric film
30, 30H: First electrode layer
31: Central portion of first electrode layer
32: End portion of first electrode layer
33: Second outer peripheral end of first electrode layer
36: Entering portion
50, 50A, 50B, 50G: First protective layer
51: Step portion
60, 60D, 60E, 60F, 60G: First metal film
63: Second metal film
70, 70A, 70B, 70C, 70D, 70E, 70F, 70G: Second protective layer
71: Step portion
100: Diffusion prevention film Ta: Thickness of electrode layer disposing portion of dielectric film Tb: Thickness of protective layer covering portion of dielectric film in outer peripheral end

The invention claimed is:

1. A semiconductor device comprising:
a semiconductor substrate that includes a first main surface and a second main surface opposite each other;
a dielectric film on a part of the first main surface, the dielectric film having an electrode layer disposing portion and a protective layer covering portion, and a thickness of the protective layer covering portion in a first outer peripheral end of the dielectric film is smaller than a thickness of the electrode layer disposing portion of the dielectric film;
a first electrode layer on the electrode layer disposing portion of the dielectric film;
a first protective layer continuously covering a second outer peripheral end of the first electrode layer and at least a part of the protective layer covering portion of the dielectric film; and
a second protective layer covering the first protective layer, wherein
the first protective layer has a relative permittivity lower than that of the second protective layer, and
the second protective layer has moisture resistance higher than that of the first protective layer.

2. The semiconductor device according to claim 1, wherein the first protective layer continuously covers a portion from the end portion of the first electrode layer to at least a part of the protective layer covering portion of the dielectric film.

3. The semiconductor device according to claim 1, wherein the first protective layer continuously covers a portion from the second outer peripheral end of the first electrode layer to the first outer peripheral end of the protective layer covering portion.

4. The semiconductor device according to claim 1, further comprising a first metal film between the first protective layer and the second protective layer, the first metal film covering at least a part of the first protective layer.

5. The semiconductor device according to claim 4, wherein the first protective layer is covered by the second protective layer and the first metal film.

6. The semiconductor device according to claim 4, wherein the first protective layer has a step portion having one or more corner portions, and the first metal film covers at least one corner portion of the one or more corner portions.

7. The semiconductor device according to claim 6, wherein the first metal film straddles the electrode layer disposing portion and the protective layer covering portion.

8. The semiconductor device according to claim 6, wherein the first metal film extends towards an inner side of the semiconductor device from a boundary between the electrode layer disposing portion and the protective layer covering portion.

9. The semiconductor device according to claim 4, wherein
the first electrode layer has an end portion thereof covered by the first protective layer, and
the first metal film is electrically connected to the first electrode layer, and is exposed on a central portion of the first electrode layer.

10. The semiconductor device according to claim 4, wherein
a third outer peripheral end of the first protective layer is covered by the second protective layer,
the first metal film continuously covers the first protective layer other than the third outer peripheral end, and
a thickness of the first protective layer is equal to or greater than a thickness of the electrode layer disposing portion of the dielectric film.

11. The semiconductor device according to claim 4, further comprising a second metal film that covers a third outer peripheral end of the first protective layer and is separated from the first metal film by a cavity.

12. The semiconductor device according to claim 4, further comprising a diffusion prevention film between the first electrode layer and the first metal film.

13. The semiconductor device according to claim 12, wherein
the first electrode layer is formed of polysilicon,
the diffusion prevention film is formed of an Al—Si based alloy, and
the first metal film is formed of Al.

14. The semiconductor device according to claim 1, wherein an electrical resistivity of the semiconductor substrate is 0.001 $\Omega$cm to 100 $\Omega$cm.

15. The semiconductor device according to claim 1, wherein
the first protective layer is formed of an oxide, and
the second protective layer is formed of a nitride.

16. The semiconductor device according to claim 1, wherein
the first protective layer is formed of an oxide of a main component of the semiconductor substrate, and
the second protective layer is formed of a nitride as the main component of the semiconductor substrate.

17. The semiconductor device according to claim 1, wherein
the semiconductor substrate has a trench on the first main surface thereof,
the electrode layer disposing portion of the dielectric film is continuously disposed on the first main surface so as to cover an inner surface of the trench to form a recess, and
the first electrode layer has an entering portion that enters the recess.

18. The semiconductor device according to claim 17, further comprising a first metal film between the first protective layer and the second protective layer, the first metal film covering at least a part of the first protective layer.

19. The semiconductor device according to claim 18, wherein the first protective layer is covered by the second protective layer and the first metal film.

20. The semiconductor device according to claim 18, wherein the first protective layer has a step portion having one or more corner portions, and the first metal film covers at least one corner portion of the one or more corner portions.

* * * * *